US008648584B2

(12) United States Patent
Horio et al.

(10) Patent No.: US 8,648,584 B2
(45) Date of Patent: Feb. 11, 2014

(54) MULTI-HYSTERESIS VOLTAGE CONTROLLED CURRENT SOURCE SYSTEM

(75) Inventors: Yoshihiko Horio, Warabi (JP); Takuya Hamada, Iruma (JP); Kenya Jinno, Yokohama (JP); Kazuyuki Aihara, Narashino (JP)

(73) Assignee: Japan Science and Technology Agency, Kawaguchi-Shi, Saitama (JP)

( * ) Notice: Subject to any disclaimer, the term of this patent is extended or adjusted under 35 U.S.C. 154(b) by 366 days.

(21) Appl. No.: 13/147,521

(22) PCT Filed: Feb. 1, 2010

(86) PCT No.: PCT/JP2010/000571
§ 371 (c)(1),
(2), (4) Date: Aug. 2, 2011

(87) PCT Pub. No.: WO2010/089983
PCT Pub. Date: Aug. 12, 2010

(65) Prior Publication Data
US 2011/0285376 A1    Nov. 24, 2011

(30) Foreign Application Priority Data
Feb. 6, 2009    (JP) .................... 2009-025790

(51) Int. Cl.
*G05G 5/00* (2006.01)
*G05F 3/16* (2006.01)
*G05F 3/20* (2006.01)
*G05F 1/10* (2006.01)
*G05F 3/02* (2006.01)

(52) U.S. Cl.
USPC ............ 323/299; 323/315; 327/538; 327/543

(58) Field of Classification Search
USPC ........... 323/299, 311–312, 315; 327/538, 543
See application file for complete search history.

(56) References Cited

U.S. PATENT DOCUMENTS

| 5,039,888 | A | * | 8/1991 | Bell et al. ................. 327/581 |
| 5,446,409 | A | * | 8/1995 | Katakura .................. 323/315 |
| 6,087,873 | A | * | 7/2000 | Alexander ................ 327/206 |

FOREIGN PATENT DOCUMENTS

| JP | 59-212031 | 11/1984 |
| JP | 06-069769 | 3/1994 |

OTHER PUBLICATIONS

Michael S. Branicky, "Universal Computation and Other Capabilities of Hybrid and Continuous Dynamical Systems", Theoretical Computer Science, vol. 138, 1995, pp. 1-32.
R. W. Newcomb et al., "An RC Op Amp Chaos Generator", IEEE Transactions on Circuits and Systems, vol. 30, No. 1, Jan. 1983, pp. 54-56.
Robert W. Newcomb et al., "A Binary Hysteresis Chaos Generator", in Proceedings of 1984 IEEE Int'l Symposium on Circuits and Systems, 1984, pp. 856-859.

(Continued)

*Primary Examiner* — Jue Zhang
(74) *Attorney, Agent, or Firm* — Bacon & Thomas, PLLC

(57) ABSTRACT

A multi-hysteresis voltage controlled current source system having a variety of multi-hysteresis characteristics is provided. In the multi-hysteresis voltage controlled current source system, single-hysteresis voltage controlled current source circuits $2_1, 2_2, \ldots 2_N$ as fundamental components are connected in parallel, and a differential input voltage $v_{id}$ is applied to the single-hysteresis voltage controlled current source circuits $2_1, 2_2, \ldots 2_N$, so that a plurality of discrete values of current can be output based on the single-hysteresis voltage controlled current source circuits $2_1, 2_2, \ldots 2_N$.

11 Claims, 24 Drawing Sheets

(56) References Cited

OTHER PUBLICATIONS

Toshimichi Saito, "On a Hysteresis Chaos Generator", in Proceedings of 1985 IEEE Int'l Symposium on Circuits and Systems, 1985, pp. 847-849.

Takashi Suzuki et al., "On Fundamental Bifurcations from a Hysteresis Hyperchaos Generator", IEEE Transactions on Circuits and Systems, Part I, Fundamental Theory and Applications, vol. 41, No. 12, Dec. 1994, pp. 876-884.

Toshimichi Saito et al., "Chaos from a Hysteresis and Switched Circuit", Philosophical Transactions: Physical Sciences and Engineering, vol. 353, No. 1701, 1995, pp. 47-57.

Toshimichi Saito et al., "Control of Chaos from a Piecewise Linear Hysteresis Circuit", IEEE Transactions on Circuits and Systems, Part I, Fundamental Theory and Applications, vol. 42, No. 3, Mar. 1995, pp. 168-172.

Joseph E. Varrientos et al., "A 4-D Chaotic Oscillator Based on a Differential Hysteresis Comparator", IEEE Transactions on Circuits and Systems, Part I, Fundamental Theory and Applications, vol. 45, No. 1, Jan. 1998, pp. 3-10.

Ahmed S. Elwakil et al., "Chaotic Oscillators Derived from Saito's Double-Screw Hysteresis Oscillator", IEICE Trans. Fundamentals, vol. E82-A, No. 9, Sep. 1999, pp. 1769-1775.

Masaki Kataoka et al., "A Two-Port VCCS Chaotic Oscillator and Quad Screw Attractor", IEEE Transactions on Circuits and Systems, Part I, Fundamental Theory and Applications, vol. 48, No. 2, Feb. 2001, pp. 221-225.

Federico Bizzarri et al., "Bifurcation Analysis and Its Experimental Validation for a Hysteresis Circuit Oscillator", IEEE Transactions on Circuits and Systems, Part II, Express Briefs, vol. 53, No. 7, Jul. 2006, pp. 517-521.

Fengling Han et al., "n-scroll chaotic oscillators by second-order systems and double-hysteresis blocks", Electronic Letters, vol. 39, No. 23, Nov. 13, 2003, pp. 1636-1637.

Fengling Han et al., "A New Way of Generating Grid-Scroll Chaos and its Application to Biometric Authentication", in Proceedings of IEEE 2005 Industrial Electronics Society, 31st Annual Conference, 2005, pp. 61-66.

Fengling Han et al., "On Multiscroll Chaotic Attractors in Hysteresis-Based Piecewise-Linear Systems", IEEE Transactions on Circuits and Systems, Part II, Express Briefs, vol. 54, No. 11, Nov. 2007, pp. 1004-1008.

Takuya Hamada et al., "An IC Implementation of a Hysteresis Two-Port VCCS Chaotic Oscillator", in Proceedings of European Conf. on Circuits Theory and Design, 2007, pp. 926-929.

Takuya Hamada et al., "Experimental Observations from an Integrated Hysteresis Two-Port VCCS Chaotic Oscillator", in Proceedings IEEE Int'l Workshop on Nonlinear Dynamics of Electronic Systems, 2007, pp. 237-240.

Takuya Hamada et al., "A Fully-Differential Hysteresis Two-Port VCCS Chaotic Oscillator", IEICE Technical report, NLP2007-180, 2008, pp. 79-84.

\* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

MULTI-HYSTERESIS VOLTAGE CONTROLLED CURRENT SOURCE SYSTEM

BACKGROUND OF THE INVENTION

1. Field of the Invention

The present invention relates to a multi-hysteresis voltage controlled current source (VCCS) system.

2. Description of the Related Art

In recent years, active researches have been conducted on the "hybrid dynamical system" that contains the continuous variables and the discrete variables in the system. Although the existing computer systems are constituted as a discrete system based on the binary-logic variables, the presence of the hybrid dynamical systems equivalent to the Turing machines has been proved mathematically (see Non-Patent Document 1 below). Thus, there is a possibility that the computing systems different from the existing digital computers can be constituted using the hybrid dynamical system. Moreover, when the hybrid dynamical system presents very complex phenomena such as chaos, the dynamic and complex information processing methods are also conceivable by representing the attractors of the continuous variables with discrete values.

On the other hand, the chaos generating circuits using hysteresis elements have been proposed (see Non-Patent Documents 2-11 below). These circuits use the piecewise linear single-hysteresis elements as non-linear elements, and a variety of interesting chaotic attractors have been reported. Moreover, in order to make the chaotic attractors more diverse, the method has been proposed wherein the single-hysteresis elements are replaced by multi-hysteresis elements that can obtain multivalued outputs (see Non-Patent Documents 12-14 below). In this method, grid-scroll chaotic attractors or the like can be observed. The shapes of such complex chaotic attractors depend on the multi-hysteresis characteristics to be used.

Non-Patent Document 1: Michael S. Branicky, "Universal computation and other capabilities of hybrid and continuous dynamical systems", Theoretical Computer Science, vol. 138, pp. 67-100, 1995

Non-Patent Document 2: R. W. Newcomb and S. Sathyan, "An RC op amp chaos generator", IEEE Trans. on Circuits and Systems, Part I, Fundam. Theory Appl., vol. 30, no. 1, pp. 54-56, 1983

Non-Patent Document 3: R. W. Newcomb and N. El-Leithy, "A binary hysteresis chaos generator", in Proc. of 1984 IEEE Int'l Symp. on Circuits and Systems, pp. 856-859, 1984

Non-Patent Document 4: Toshimichi Saito, "On a hysteresis chaos generator", in Proc. of 1985 IEEE Int'l Symp. on Circuits and Systems, pp. 847-849, 1985

Non-Patent Document 5: Takashi Suzuki and Toshimichi Saito, "On fundamental bifurcations from a hysteresis hyperchaos generator", IEEE Trans. on Circuits and Systems, Part I, Fundam. Theory Appl., vol. 41, no. 12, pp. 876-884, 1994

Non-Patent Document 6: Toshimichi Saito and Shinji Nakagawa, "Chaos from a hysteresis and switched circuit", Phil. Trans. R. Soc. Lond. A, vol. 353, no. 1701, pp. 47-57, 1995

Non-Patent Document 7: Toshimichi Saito and Kunihiko Mitsubori, "Control of chaos from a piecewise linear hysteresis circuit", IEEE Trans. on Circuits and Systems, Part I, Fundam. Theory Appl., vol. 42, no. 3, pp. 168-172, 1995

Non-Patent Document 8: J. E. Varrientos and E. Sanchez-Sinencio, "A 4-D chaotic oscillator based on a differential hysteresis comparator", IEEE Trans. on Circuits and Systems, Part I, Fundam. Theory Appl., vol. 45, no. 1, pp. 3-10, 1998

Non-Patent Document 9: A. S. Elwakil and M. P. Kennedy, "Chaotic Oscillators derived from Saito's double-screw hysteresis oscillator", IEICE Trans. Fundamentals, vol. E82-A, no. 9, pp. 1769-1775, 1999

Non-Patent Document 10: Masaki Kataoka and Toshimichi Saito, "A 2-port VCCS chaotic oscillator and quad screw attractor", IEEE Trans. on Circuits and Systems, Part I, Fundam. Theory Appl., vol. 48, no. 2, pp. 221-225, 2001

Non-Patent Document 11: F. Bizzarri, D. Stellardo, and M. Storace, "Bifurcation analysis and its experimental validation for a hysteresis circuit oscillator", IEEE Trans. on Circuits and Systems, Part I, Regular Papers, vol. 53, no. 7, pp. 517-521, 2006

Non-Patent Document 12: Fengling Han, Xinghuo Yu, Yuye Wang, Yong Feng, and Guanrong Chen, "n-scroll chaotic oscillators by second-order systems and double-hysteresis blocks", Electronics Letters, vol. 39, no. 23, pp. 1636-1637, 2003

Non-Patent Document 13: Fengling Han, Xinghuo Yu, and Jiankun Hu, "A new way of generating grid-scroll chaos and its application to biometric authentication", in Proc. of IEEE 2005 Industrial Electronics Society, 31st Annual Conference, pp. 61-66, 2005

Non-Patent Document 14: Fengling Han, Xinghuo Yu, Yong Feng, and Jiankun Hu, "On multiscroll chaotic attractors in hysteresis-based piecewise-linear systems", IEEE Trans. on Circuits and Systems, Part II, Express Briefs, vol. 54, no. 11, pp. 1004-1008, 2007

Non-Patent Document 15: Takuya Hamada, Yoshihiko Horio, and Kazuyuki Aihara, "An IC implementation of a hysteresis two-port VCCS chaotic oscillator", in Proc. of European Conf. on Circuits Theory and Design, pp. 926-929, 2007

Non-Patent Document 16: Takuya Hamada, Yoshihiko Horio, and Kazuyuki Aihara, "Experimental observations from an integrated hysteresis two-port VCCS chaotic oscillator", in Proc. IEEE Int'l Work-shop on Nonlinear Dynamics of Electronic Systems, pp. 237-240, 2007

Non-Patent Document 17: Takuya Hamada, Yoshihiko Horio, and Kazuyuki Aihara, "A Fully-Differential Hysteresis Two-Port VCCS Chaotic Oscillator", IEICE Technical Report, NLP2007-180, pp. 79-84, 2008

SUMMARY OF THE INVENTION

The systems having a variety of multi-hysteresis characteristics are indispensable to create various information processing features. However, the multi-hysteresis system proposed in the above-mentioned Non-Patent Documents 12-14 only presents the characteristic where the single-hysteresis characteristics are combined in series. In addition, such a multi-hysteresis characteristic is constituted by connecting a plurality of voltage controlled voltage source circuits (VCVS circuits) having the single-hysteresis characteristics. Since inputs and outputs of this type of VCVS circuits are both voltages, connecting a plurality of circuits requires an adder, resulting in the increase in scale of the circuits.

In view of the circumstances described above, the present invention is directed to provide a multi-hysteresis voltage controlled current source system having a variety of multi-hysteresis characteristics.

In order to achieve the object described above, the present invention provides the following:

[1] A multi-hysteresis voltage controlled current source system constituted by connecting single-hysteresis voltage controlled current source circuits as fundamental components in parallel, and applying a differential input voltage to the single-hysteresis voltage controlled current source circuits, so that a plurality of discrete values of current can be output based on the single-hysteresis voltage controlled current source circuits.

[2] The multi-hysteresis voltage controlled current source system according to [1] above, wherein characteristics of the single-hysteresis voltage controlled current source circuits are enabled to be set independently from each other, so that changing the characteristics allows a variety of multi-hysteresis VCCS characteristics to be obtained.

[3] The multi-hysteresis voltage controlled current source system according to [1] or [2] above, wherein N single-hysteresis voltage controlled current source circuits (N is an arbitrary positive integer) are connected in parallel.

[4] The multi-hysteresis voltage controlled current source system according to [1] or [2] above, wherein the single-hysteresis voltage controlled current source circuits connected in parallel include only a combination of circuits having a normal hysteresis characteristic.

[5] The multi-hysteresis voltage controlled current source system according to [1] or [2] above, wherein the single-hysteresis voltage controlled current source circuits connected in parallel include only a combination of circuits having an inverse hysteresis characteristic.

[6] The multi-hysteresis voltage controlled current source system according to [1] or [2] above, wherein the single-hysteresis voltage controlled current source circuits connected in parallel include a combination of a circuit having the normal hysteresis characteristic and a circuit having the inverse hysteresis characteristic.

[7] The multi-hysteresis voltage controlled current source system according to [6] above, wherein the single-hysteresis voltage controlled current source circuits connected in parallel include a combination of two circuits each having the normal hysteresis characteristic and the inverse hysteresis characteristic.

[8] The multi-hysteresis voltage controlled current source system according to [4], [5], or [6] above, wherein three single-hysteresis voltage controlled current source circuits are connected in parallel.

[9] The multi-hysteresis voltage controlled current source system according to [1] or [2] above, wherein the single-hysteresis voltage controlled current source circuits connected in parallel include an operational transconductance amplifier (OTA) and a latch circuit.

[10] The multi-hysteresis voltage controlled current source system according to [9] above, wherein a range of threshold voltages is changed by controlling external control voltage ($V_{he}$) of the latch circuit.

[11] The multi-hysteresis voltage controlled current source system according to [1] or [2] above, wherein the single-hysteresis voltage controlled current source circuits connected in parallel incorporate three fully-differential single-hysteresis voltage controlled current source circuits.

A multi-hysteresis voltage controlled current source system of the present invention enables a multi-hysteresis VCCS circuit to be constituted easily by combining a plurality of single-hysteresis VCCS circuits in parallel of which the input is voltage and the output is current.

Moreover, the single-hysteresis VCCS circuit as a component of the multi-hysteresis VCCS circuit can be set up its characteristic independently from each other, so that changing the characteristics allows a variety of multi-hysteresis VCCS characteristics to be realized easily.

DESCRIPTION OF THE PREFERRED EMBODIMENTS

A multi-hysteresis voltage controlled current source system according to the present invention is constituted by connecting single-hysteresis voltage controlled current source circuits as fundamental components in parallel, so that a plurality of discrete values of current can be output based on the single-hysteresis voltage controlled current source circuits.

Embodiments

Hereinafter, embodiments of the present invention will be described in detail.

A method of realizing a multi-hysteresis VCCS characteristic of the present invention will be described.

Figure 1:
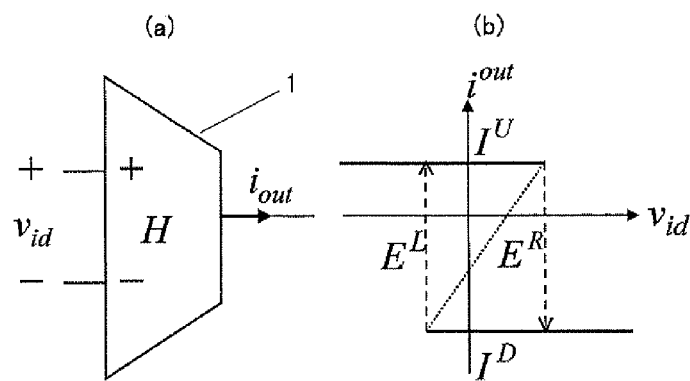
FIG. 1 shows an illustrative diagram of a single-hysteresis voltage controlled current source element.

FIG. 1 shows an illustrative diagram of a single-hysteresis voltage controlled current source element, wherein FIG. 1(a) shows a circuit symbol of a fundamental single-hysteresis element for combining a multi-hysteresis characteristic, and FIG. 1(b) shows its input and output characteristics.

This single-hysteresis element 1 is a voltage controlled current source (VCCS) circuit of which an output current $i^{out}$ for a differential-input voltage $v_{id}$ presents the hysteresis characteristic as shown in FIG. 1(b). Among two saturation currents shown in FIG. 1(b), the output saturation current defined as an output when the differential-input voltage $v_{id}$ is lower than a threshold voltage $E^R$ of the hysteresis is denoted as $I^U$, and the output saturation current when the differential-input voltage $v_{id}$ is higher than a threshold voltage $E^L$ is denoted as $I^D$. Here, note that $E^L < E^R$. When the differential-input voltage $v_{id}$ reaches $E^R$ while the output current $i^{out}$ is $I^U$, the output current $i^{out}$ is switched to $I^D$. Similarly, when the differential-input voltage $v_{id}$ reaches $E^L$ while the output current $i^{out}$ is $I^D$, the output current $i^{out}$ is switched to $I^U$. Therefore, a $v_{id}$-$i^{out}$ characteristic of this circuit is described by the following equation (1).

[Formula 1]

$$i^{out} = H(v_{id}) = \begin{cases} I^U & \text{for } v_{id} \le E^R \\ I^D & \text{for } v_{id} \ge E^L \end{cases} \quad (1)$$

where $H(v_{id})$ represents a single-hysteresis characteristic.

Figure 2:
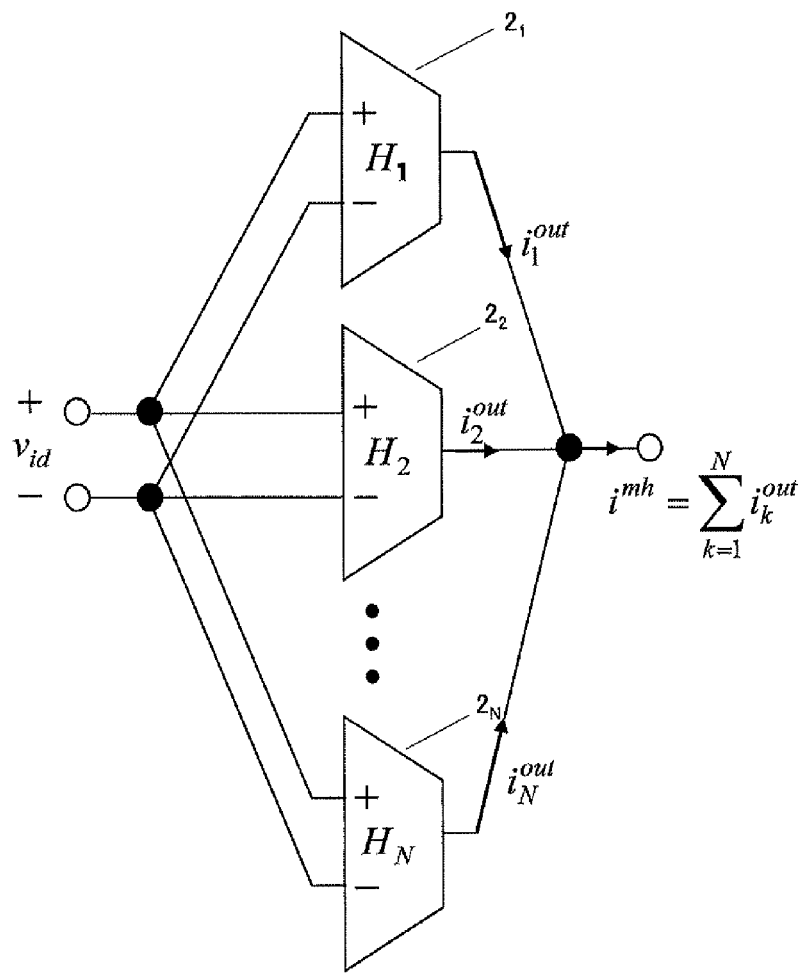
FIG. 2 shows a configuration of a multi-hysteresis voltage controlled current source system illustrating an embodiment of the present invention.

FIG. 2 shows a configuration of a multi-hysteresis voltage controlled current source system illustrating an embodiment of the present invention.

Since the above-described single-hysteresis VCCS circuit is a current output type, N single-hysteresis VCCS circuits $2_1$ to $2_N$ (N is an arbitrary positive integer) can be connected easily in parallel as shown in FIG. 2. In this regard, an overall output current $i^{mh}$ can be represented by the following equation (2).

Figure 3:
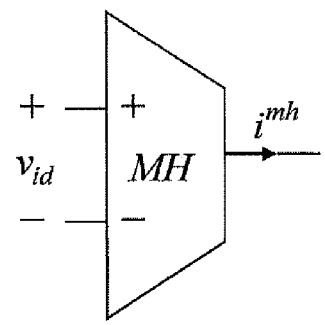
FIG. 3 shows the circuit symbol of a multi-hysteresis voltage controlled current source element illustrating an embodiment of the present invention.

[Formula 2]

$$i^{mh} = MH(v_{id}) = \sum_{k=1}^{N} H_k(v_{id}) = \sum_{k=1}^{N} i_k^{out} \quad (2)$$

where k represents a k-th single-hysteresis VCCS circuit. In FIG. 2, if each single-hysteresis characteristic $H_k(v_{id})$ has a different threshold value, the overall output current $i^{mh}$ has the multi-output hysteresis characteristic of multivalued outputs, i.e. the multi-hysteresis characteristic. Such an element of which the overall output current $i^{mh}$ for the differential-input voltage $v_{id}$ has the multi-hysteresis characteristic is represented by the symbol shown in FIG. 3 hereinbelow.

Here, the threshold voltages of the k-th single-hysteresis characteristic $H_k(v_{id})$ are denoted as $E^R_k$ and $E^L_k$ ($E^R_k > E^L_k$). In addition, the saturation output current value defined by $v_{id} \le E^R k$ is denoted as $I^U_k$, and the saturation output current value defined by $v_{id} \ge E^L_k$ is denoted as $I^D_k$. Moreover, as described in the following equation (3), a binary variable $b_k$ is introduced, which is "1" if the output of the k-th single-hysteresis VCCS circuit is the saturation output current value $I^U_k$, or otherwise "0".

[Formula 3]

$$b_k = B(i_k^{out}) = \begin{cases} 1, & \text{for } i_k^{out} = I_k^U \\ 0, & \text{otherwise} \end{cases} \quad (3)$$

where $B(i^{out}_k)$ represents a function that gives a conversion from a continuous variable $i^{out}_k$ to the binary variable $b_k$. In this regard, the overall output current $i^{mh}$ of the multi-hysteresis VCCS circuit can be described by the following equation (4).

[Formula 4]

$$i^{mh} = MH(v_{id}) = \sum_{k=1}^{N} (I_k^U b_k + I_k^D \overline{b}_k) \text{ for } \max_{b_n=0}(E_n^L) \le v_{id} \le \min_{b_p=1}(E_p^R) \quad (4)$$

where $\overline{b}_k$ represents the inversion of $b_k$. Moreover, $$\max_{b_n=0}(E_n^L)$$

represents the maximum value of the lower threshold voltage of the single-hysteresis VCCS circuit of which the output $i^{out}_k \ne I^U_k$ (i.e. $b_k=0$), and $$\min_{b_p=1}(E_p^R)$$

represents the minimum value of the higher threshold voltage of the single-hysteresis VCCS circuit of which the output $i^{out}_k = I^U_k$ (i.e. $b_k=1$). Here, n and p are indexes, and $1 \le n \le N$ and $1 \le p \le N$.

On the other hand, the output state of the single-hysteresis characteristic contained in the multi-hysteresis characteristic is represented by the integer m described as:

[Formula 5]

$$m = 1 + \sum_{k=1}^{N} b_k 2^{k-1} \quad (5)$$

Moreover, the overall output current $i^{mh}$ of the multi-hysteresis VCCS circuit when the output state is m is denoted as $I_m$.

Figure 4:
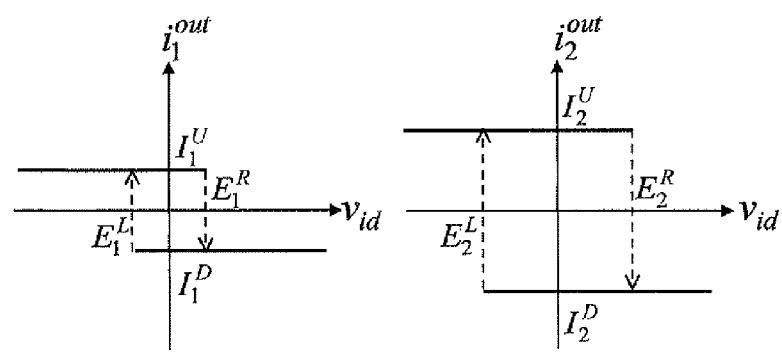
FIG. 4 shows a first example of a multi-hysteresis characteristic constituted by connecting two single-hysteresis VCCS circuits in parallel.
Figure 4:
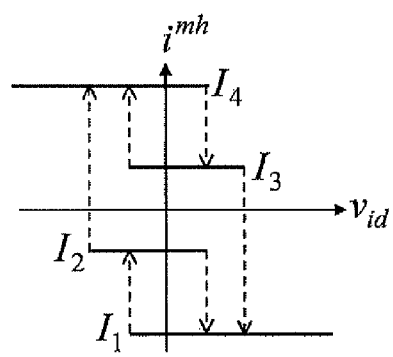
Figure 5:
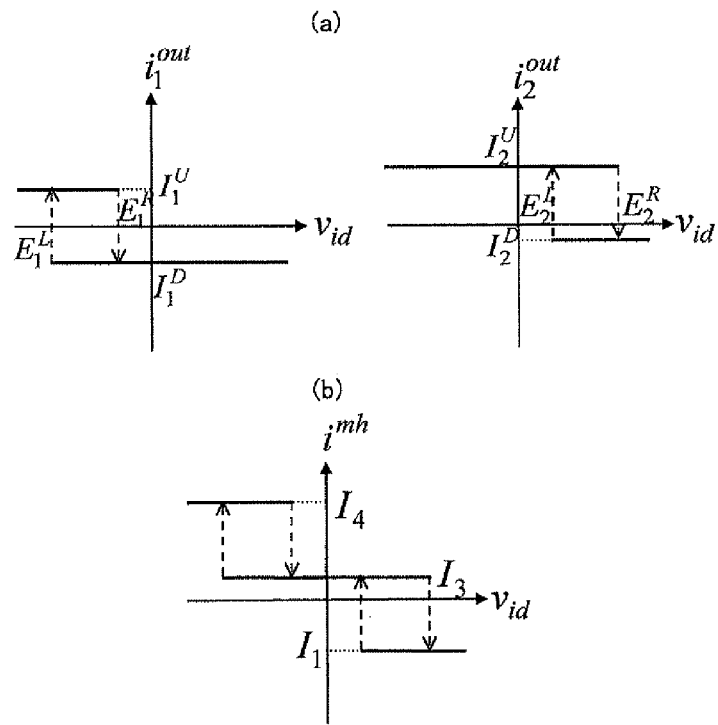
FIG. 5 shows a second example of the multi-hysteresis characteristic constituted by connecting two single-hysteresis VCCS circuits in parallel.
Figure 6:
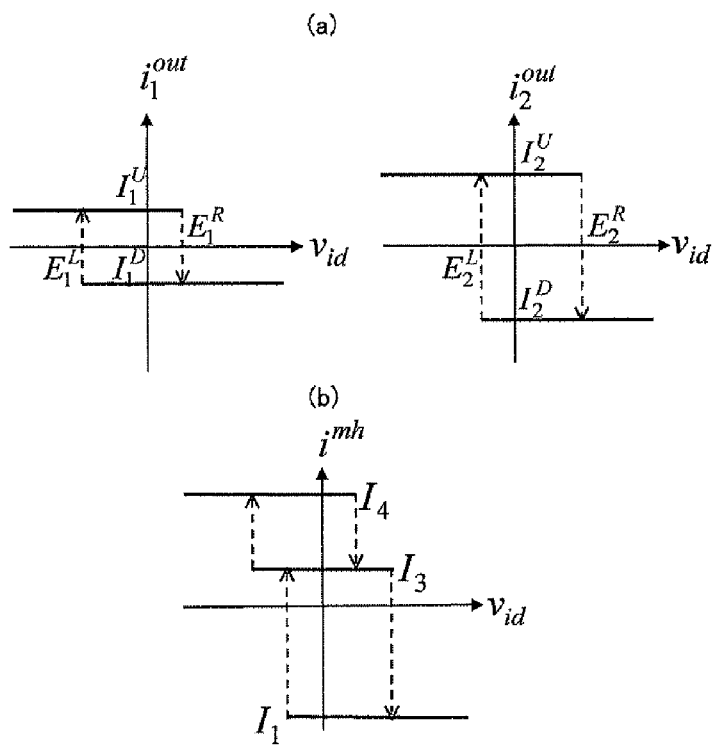
FIG. 6 shows a third example of the multi-hysteresis characteristic constituted by connecting two single-hysteresis VCCS circuits in parallel.

As the most simplified configuration examples of the multi-hysteresis VCCS system of the present invention, FIGS. 4-6 show first to third examples of the multi-hysteresis characteristic obtained by combining two single-hysteresis VCCS circuits.

As shown in these figures, the relationship between the constituent two single-hysteresis VCCS circuits can be generally classified into three types: (i) one with a nested structure of the hysteresis intervals ($E^L_2 \le E^L_1 < E^R_1 \le E^R_2$, FIG. 4); (ii) one with a non-overlapped structure of the hysteresis intervals ($E^L_1 < E^R_1 \le E^L_2 < E^R_2$, FIG. 5); and (iii) one with a partial-overlapped structure of the hysteresis intervals ($E^L_1 \le E^L_2 < E^R_1 \le E^R_2$, FIG. 6).

In general, when the hysteresis intervals of N single-hysteresis VCCS circuits (N is an arbitrary positive integer) constitutes the nested structure with each other [(i)], the total number of switching points SW of an output current value in the combined multi-hysteresis characteristic is, if all the threshold voltages have different values, given by:

[Formula 6]

$$SW = \sum_{k=1}^{N} 2^k = 2^{N+1} - 2 \quad (6)$$

For example, in the case of FIG. 4(b), there are six output switching points.

On the other hand, when the hysteresis intervals of the constituent single-hysteresis characteristics do not overlap at all [(ii)] or only some of them overlap [(iii)], the total number of the switching points SW of the output current value in the multi-hysteresis characteristic combined by N single-hysteresis VCCS circuits (N is an arbitrary positive integer) is, if all the threshold voltages have different values, given by:

$$SW = 2N \quad (7)$$

For example, in the cases of FIGS. 5(b) and 6(b), there are four output switching points, respectively.

Figure 7:
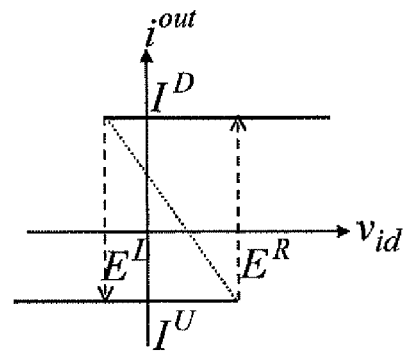
FIG. 7 shows a characteristic of the inverse single-hysteresis VCCS.
Figure 8:
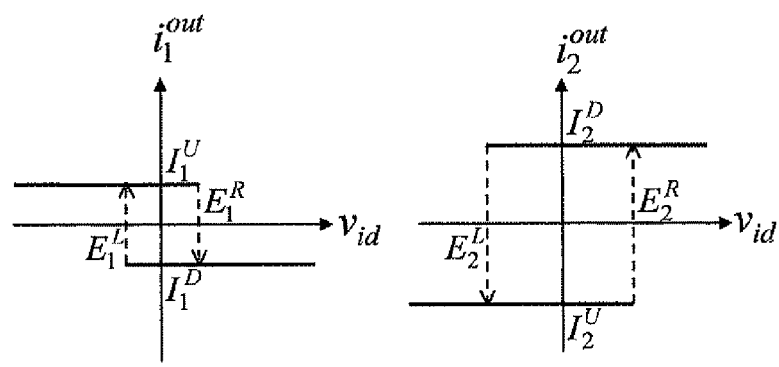
FIG. 8 shows a first example of the multi-hysteresis characteristic constituted by connecting the single-hysteresis VCCS circuits in parallel, of which one having a normal hysteresis and one having an inverse hysteresis.
Figure 8:
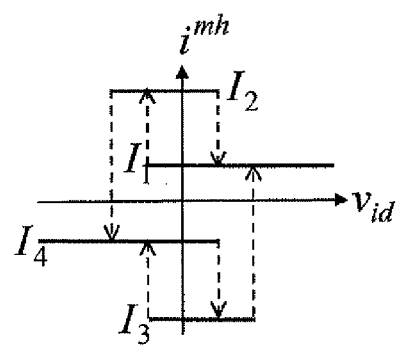
Figure 9:
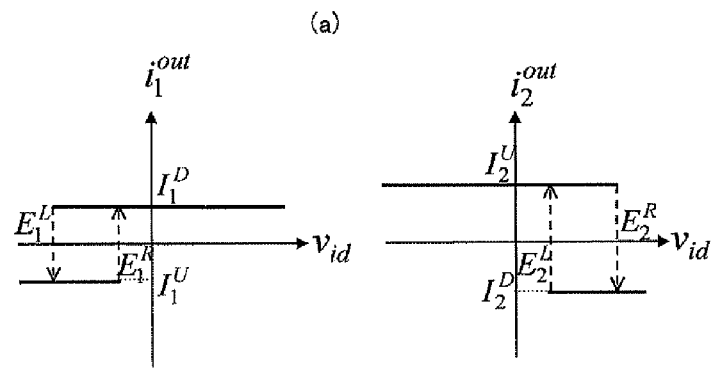
FIG. 9 shows a second example of the multi-hysteresis characteristic constituted by connecting the single-hysteresis VCCS circuits in parallel, of which one having the normal hysteresis and one having the inverse hysteresis.
Figure 9:
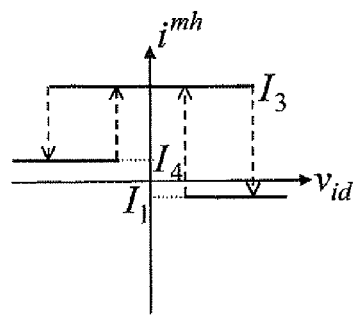
Figure 10:
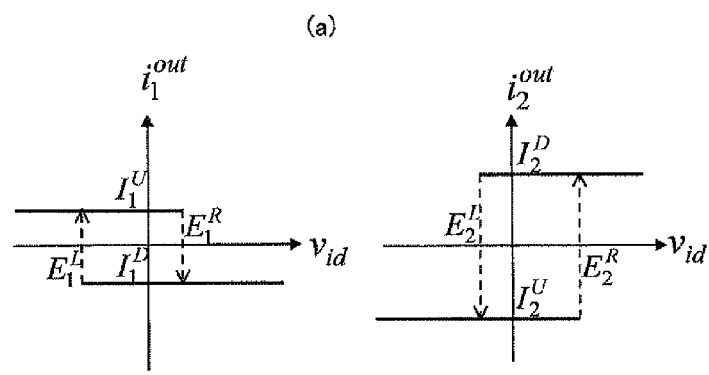
FIG. 10 shows a third example of the multi-hysteresis characteristic constituted by connecting the single-hysteresis VCCS circuits in parallel, of which one having the normal hysteresis and one having the inverse hysteresis.
Figure 10:
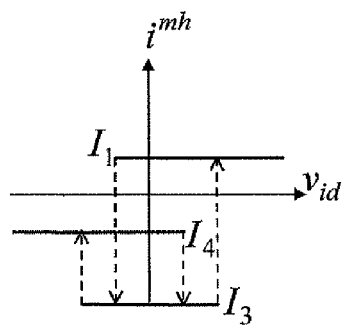

Here, the single-hysteresis VCCS circuits constituting the multi-hysteresis VCCS system can be, as shown in FIG. 7, made to have the characteristic that is inverse of FIG. 1(b), i.e. $I^U_k < I^D_k$. FIGS. 8-10 show first to third examples of the multi-hysteresis characteristic obtained by combining two single-hysteresis VCCS circuits having the inverse characteristic as mentioned above and the normal characteristic, respectively.

Again in this case, the relationship between the respective single-hysteresis VCCS circuits constituting the multi-hysteresis VCCS system can be generally classified into three types: (i) one with a nested structure of the hysteresis intervals ($E^L_2 \leq E^L_1 < E^R_1 \leq E^R_2$, FIG. 8); (ii) one with a non-overlapped structure of the hysteresis intervals ($E^L_1 < E^R_1 \leq E^L_2 < E^R_2$, FIG. 9); and (iii) one with a partial-overlapped structure of the hysteresis intervals ($E^L_1 \leq E^L_2 < E^R_1 \leq E^R_2$, FIG. 10). When the hysteresis intervals constitute the nested structure with each other [(i)], the total number of the switching points SW of the output saturation current of the multi-hysteresis characteristic is given by the equation (6) above, and in other cases [(ii), (iii)], it is given by the equation (7) above.

Next, the examples of the multi-hysteresis characteristic in the case where three single-hysteresis VCCS circuits are connected in parallel will be described.

Figure 11:
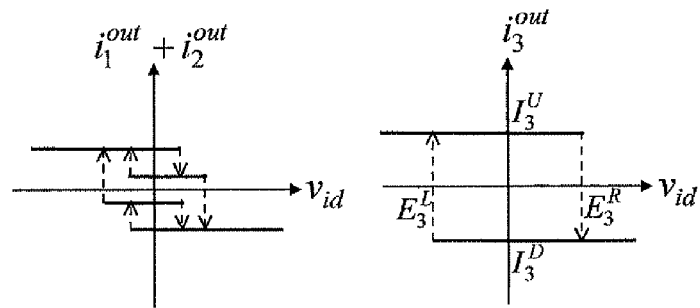
FIG. 11 shows a first example of the multi-hysteresis characteristic constituted by connecting three single-hysteresis VCCS circuits in parallel.
Figure 11:
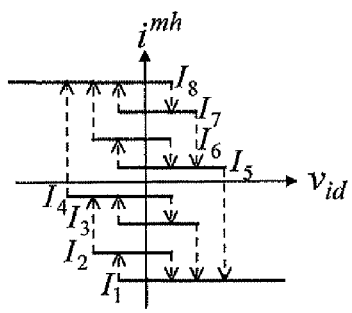
Figure 12:
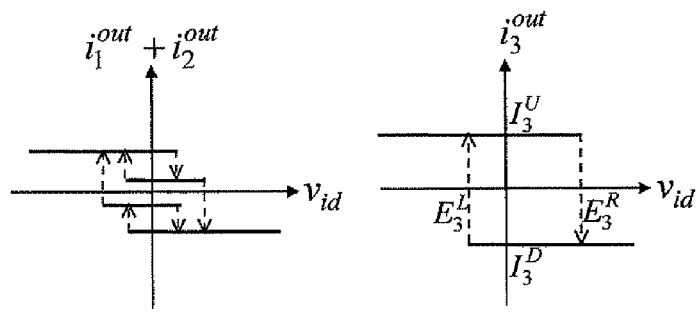
FIG. 12 shows a second example of the multi-hysteresis characteristic constituted by connecting three single-hysteresis VCCS circuits in parallel.
Figure 12:
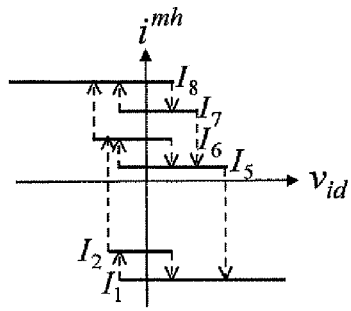
Figure 13:
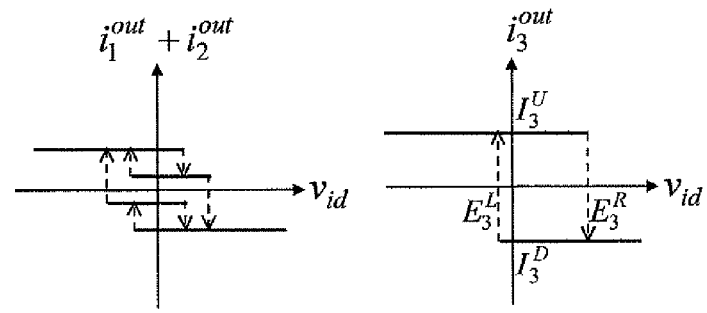
FIG. 13 shows a third example of the multi-hysteresis characteristic constituted by connecting three single-hysteresis VCCS circuits in parallel.
Figure 13:
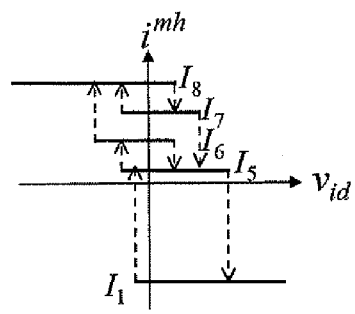
Figure 14:
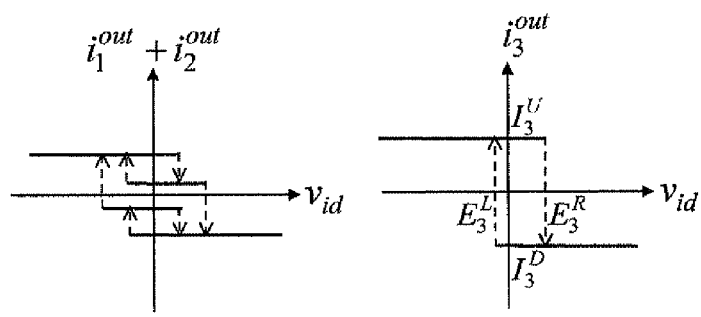
FIG. 14 shows a fourth example of the multi-hysteresis characteristic constituted by connecting three single-hysteresis VCCS circuits in parallel.
Figure 14:
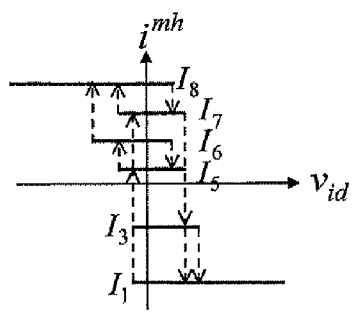
Figure 15:
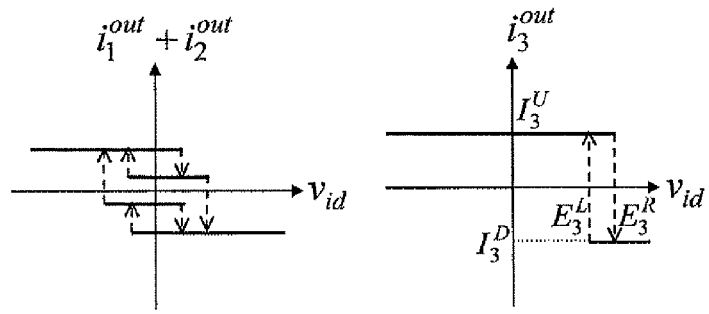
FIG. 15 shows a fifth example of the multi-hysteresis characteristic constituted by connecting three single-hysteresis VCCS circuits in parallel.
Figure 15:
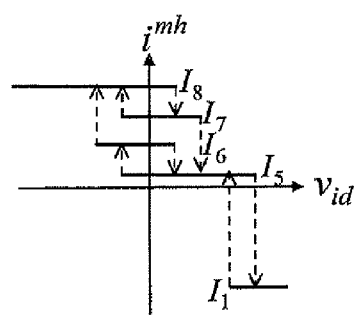

First, FIGS. 11-15 show first to fifth examples where two single-hysteresis VCCS circuits having the hysteresis characteristics in the nested structure as shown in FIG. 4 are connected with each other, that are also connected with another single-hysteresis VCCS circuit. FIG. 11 shows the case where the hysteresis characteristics of three single-hysteresis VCCS circuits have the nested structure ($E^L_3 \leq E^L_2 \leq E^L_1 < E^R_1 \leq E^R_2 \leq E^R_3$); FIG. 12 shows the case where the left threshold of the hysteresis characteristic of the third single-hysteresis VCCS circuit is present between the left thresholds of the hysteresis characteristics of the first and second single-hysteresis VCCS circuits ($E^L_2 \leq E^L_3 \leq E^L_1 < E^R_1 \leq E^R_2 \leq E^R_3$); FIG. 13 shows the case where the left threshold of the hysteresis characteristic of the third single-hysteresis VCCS circuit is present inside of the threshold of the hysteresis characteristic of the first single-hysteresis VCCS circuit ($E^L_2 \leq E^L_1 \leq E^L_3 \leq E^R_1 \leq E^R_2 \leq E^R_3$); FIG. 14 shows the case where the left threshold of the hysteresis characteristic of the third single-hysteresis VCCS circuit is present inside of the threshold of the hysteresis characteristic of the second single-hysteresis VCCS circuit, while the right threshold of the hysteresis characteristic of the third single-hysteresis VCCS circuit is present between the right thresholds of the hysteresis characteristics of the first and second single-hysteresis VCCS circuits ($E^L_2 \leq E^L_1 \leq E^L_3 < E^R_1 \leq E^R_3 \leq E^R_2$); and FIG. 15 shows the case where the hysteresis interval of the hysteresis characteristic of the third single-hysteresis VCCS circuit does not overlap with the hysteresis characteristics of the other single-hysteresis VCCS circuits ($E^L_2 \leq E^L_1 < E^R_1 \leq E^R_2 \leq E^L_3 < E^R_3$).

Figure 16:
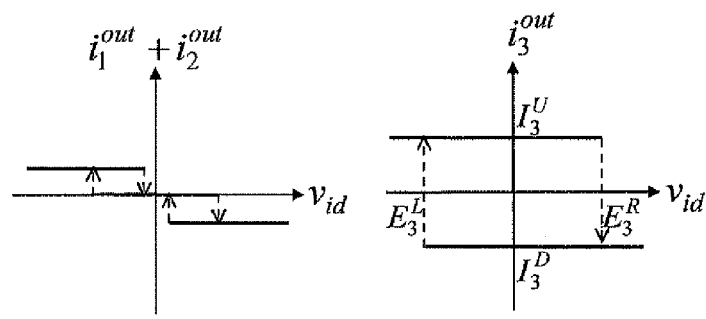
FIG. 16 shows a sixth example of the multi-hysteresis characteristic constituted by connecting three single-hysteresis VCCS circuits in parallel.
Figure 16:
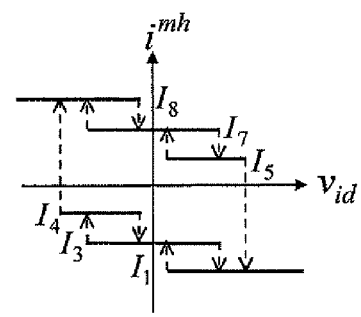
Figure 17:
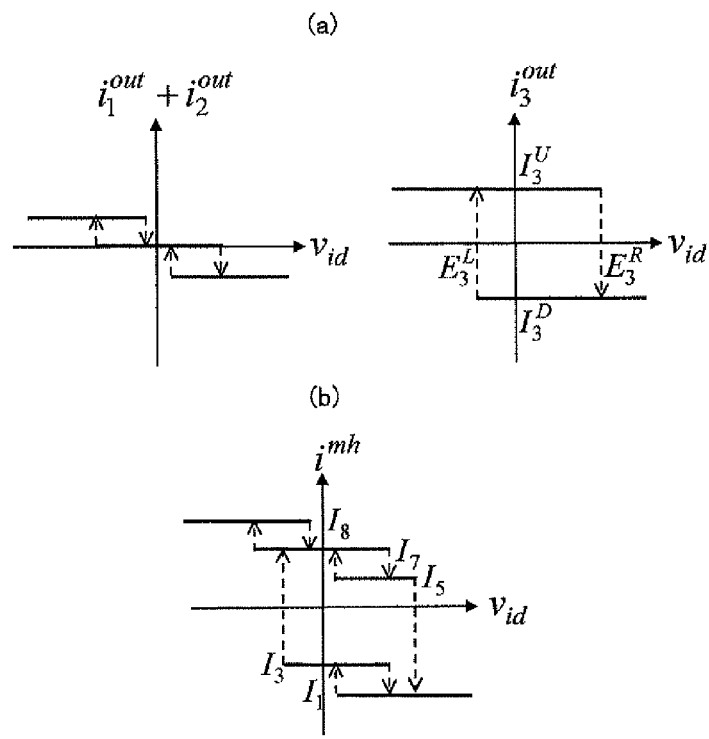
FIG. 17 shows a seventh example of the multi-hysteresis characteristic constituted by connecting three single-hysteresis VCCS circuits in parallel.
Figure 18:
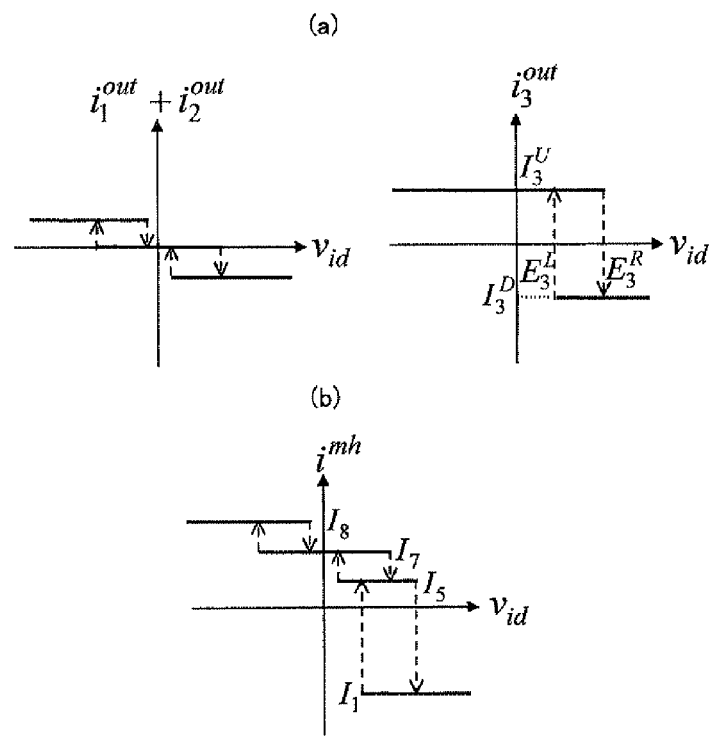
FIG. 18 shows an eighth example of the multi-hysteresis characteristic constituted by connecting three single-hysteresis VCCS circuits in parallel.
Figure 19:
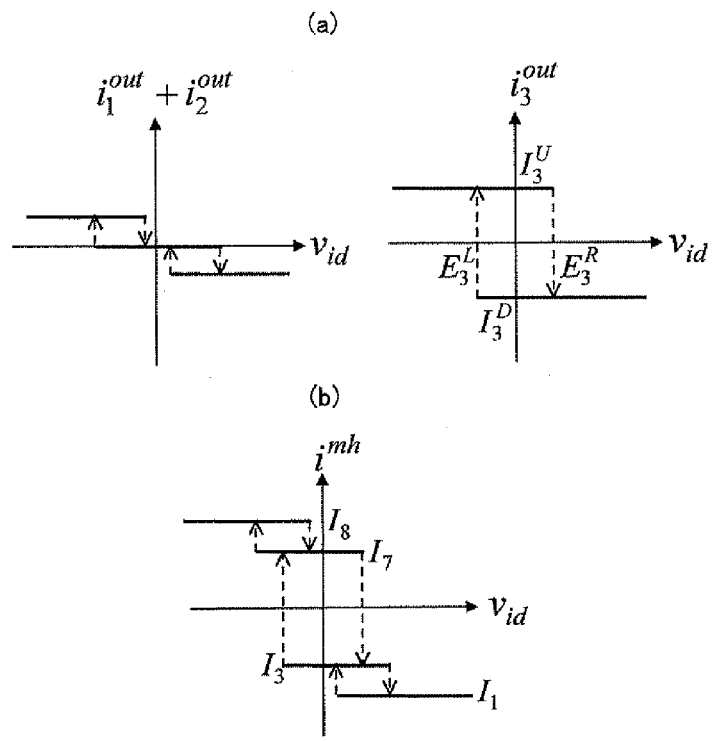
FIG. 19 shows a ninth example of the multi-hysteresis characteristic constituted by connecting three single-hysteresis VCCS circuits in parallel.
Figure 20:
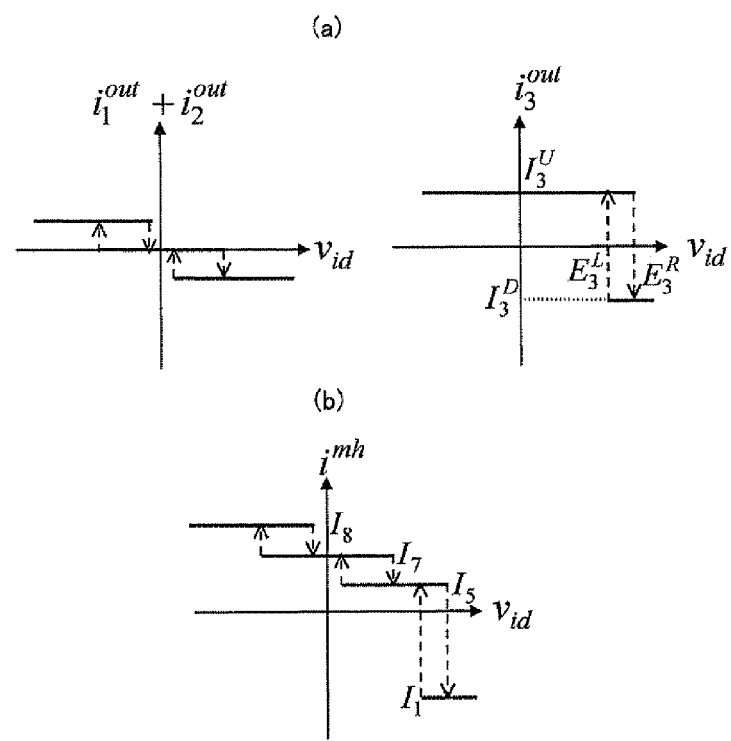
FIG. 20 shows a tenth example of the multi-hysteresis characteristic constituted by connecting three single-hysteresis VCCS circuits in parallel.

Moreover, FIGS. 16-20 show sixth to tenth examples where two single-hysteresis VCCS circuits having the hysteresis intervals of the hysteresis characteristics in the non-overlapped structure as shown in FIG. 5 are connected with each other, that are also connected with another single-hysteresis VCCS circuit. FIG. 16 shows the case where both the left and right thresholds of the third single-hysteresis VCCS circuit are present outside of the thresholds of the hysteresis characteristics of the other two single-hysteresis VCCS circuits, respectively ($E^L_3 \leq E^L_1 < E^R_1 \leq E^L_2 < E^R_2 \leq E^R_3$); FIG. 17 shows the case where the left threshold of the hysteresis characteristic of the third single-hysteresis VCCS circuit is present within the hysteresis interval of the hysteresis characteristic of the first single-hysteresis VCCS circuit ($E^L_1 \leq E^L_3 < E^R_1 \leq E^L_2 < E^R_2 \leq E^R_3$); FIG. 18 shows the case where the left threshold of the hysteresis characteristic of the third single-hysteresis VCCS circuit is present within the hysteresis interval of the hysteresis characteristic of the second single-hysteresis VCCS circuit ($E^L_2 < E^R_1 \leq E^L_2 \leq E^L_3 < E^R_2 \leq E^R_3$); FIG. 19 shows the case where the left threshold of the hysteresis characteristic of the third single-hysteresis VCCS circuit is present within the hysteresis interval of the hysteresis characteristic of the first single-hysteresis VCCS circuit, while the right threshold is present within the hysteresis interval of the hysteresis characteristic of the second single-hysteresis VCCS circuit ($E^L_1 \leq E^L_3 < E^R_1 \leq E^L_2 \leq E^R_3 < E^R_2$); and FIG. 20 shows the case where the hysteresis interval of the hysteresis characteristic of the third single-hysteresis VCCS circuit does not overlap with the hysteresis intervals of the hysteresis characteristics of the other two single-hysteresis VCCS circuits ($E^L_1 < E^R_1 \leq E^L_2 < E^R_2 \leq E^L_3 < E^R_3$).

Among those described above, the characteristics in FIGS. 5(b) and 20(b) are equivalent to the multi-hysteresis characteristics used in the above-mentioned Non-Patent Documents 12, 13, and 14, that can also be realized more easily by means of the multi-hysteresis VCCS circuit of the present invention.

Figure 21:
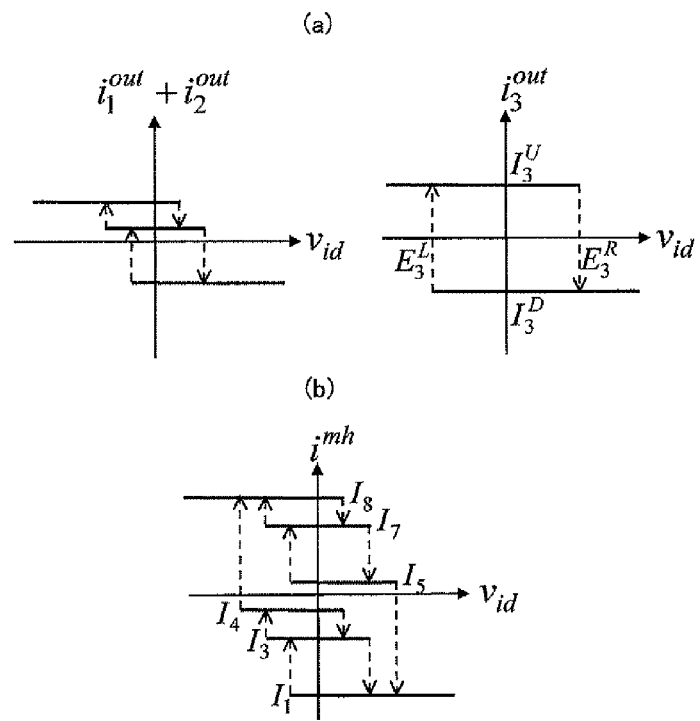
FIG. 21 shows an eleventh example of the multi-hysteresis characteristic constituted by connecting three single-hysteresis VCCS circuits in parallel.
Figure 22:
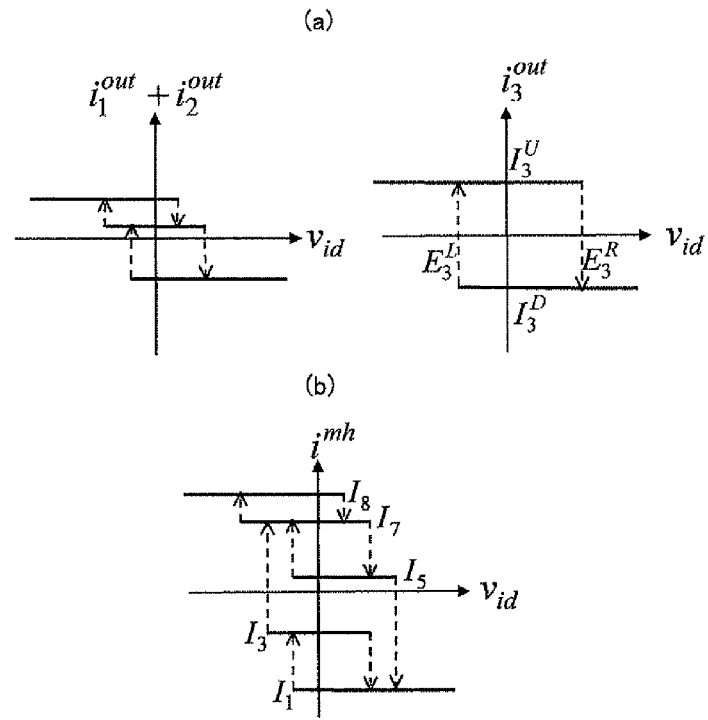
FIG. 22 shows a twelfth example of the multi-hysteresis characteristic constituted by connecting three single-hysteresis VCCS circuits in parallel.
Figure 23:
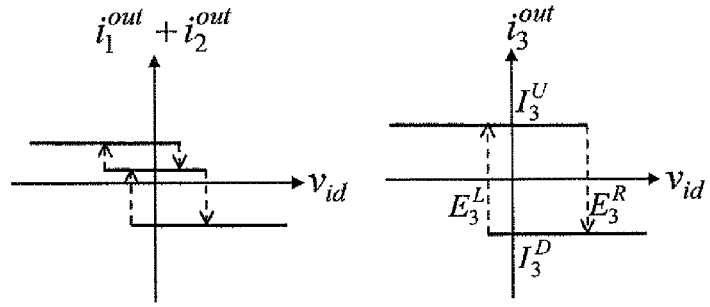
FIG. 23 shows a thirteenth example of the multi-hysteresis characteristic constituted by connecting three single-hysteresis VCCS circuits in parallel.
Figure 23:
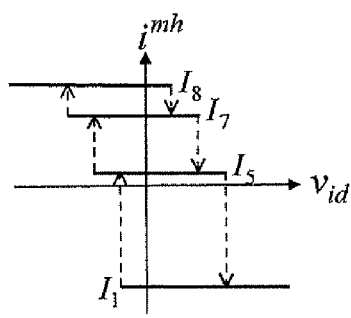
Figure 24:
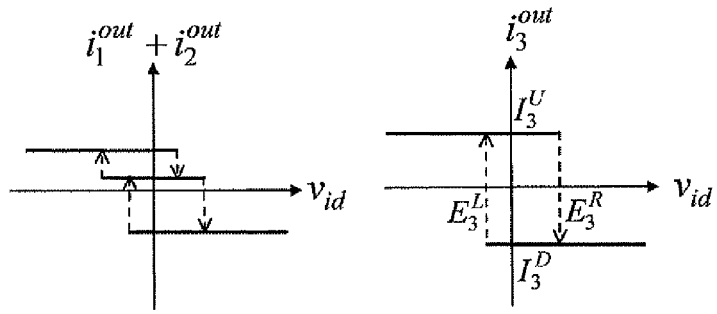
FIG. 24 shows a fourteenth example of the multi-hysteresis characteristic constituted by connecting three single-hysteresis VCCS circuits in parallel.
Figure 24:
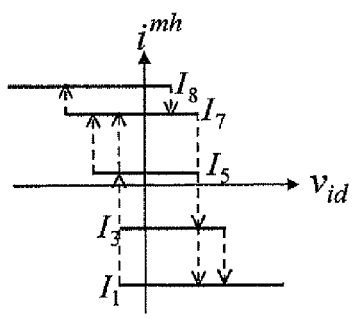
Figure 25:
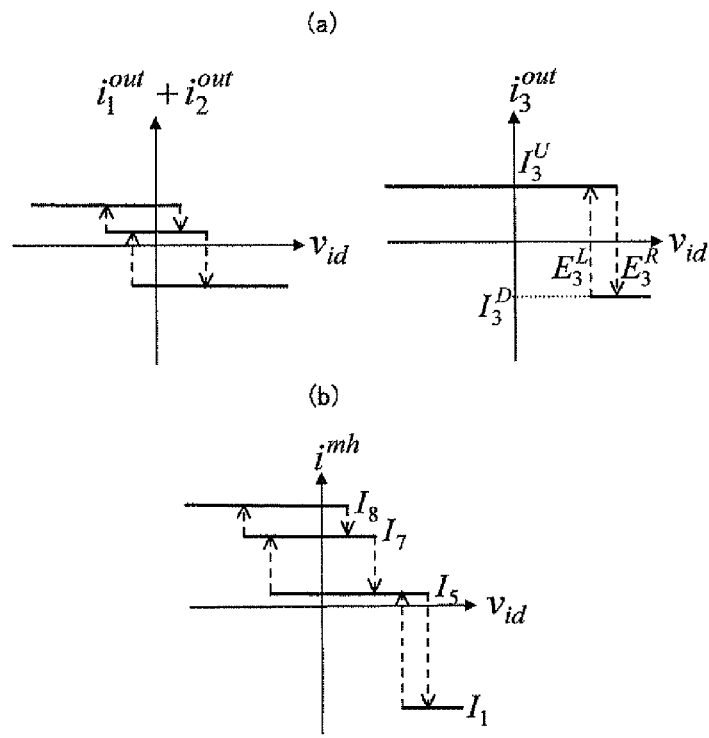
FIG. 25 shows a fifteenth example of the multi-hysteresis characteristic constituted by connecting three single-hysteresis VCCS circuits in parallel.

Furthermore, FIGS. 21-25 show eleventh to fifteenth examples of the multi-hysteresis characteristic obtained by connecting two single-hysteresis VCCS circuits having the hysteresis intervals in the partial-overlapped structure as shown in FIG. 6, that are also connected with another single-hysteresis VCCS circuit. FIG. 21 shows the case where both the left and right thresholds of the hysteresis characteristic of the third single-hysteresis VCCS circuit are present outside of the thresholds of the hysteresis characteristics of the other two single-hysteresis VCCS circuits, respectively ($E^L_3 \leq E^L_1 \leq E^L_2 < E^R_1 \leq E^R_2 \leq E^R_3$); FIG. 22 shows the case where the left threshold of the hysteresis characteristic of the third single-hysteresis VCCS circuit is present between the left thresholds of the hysteresis characteristics of the first and second single-hysteresis VCCS circuits ($E^L_1 \leq E^L_3 \leq E^L_2 < E^R_1 \leq E^R_2 \leq E^R_3$); FIG. 23 shows the case where the left threshold of the hysteresis characteristic of the third single-hysteresis VCCS circuit is present within the overlapped hysteresis intervals of the hysteresis characteristics of the other two single-hysteresis VCCS circuits ($E^L_1 \leq E^L_2 \leq E^L_3 < E^R_1 \leq E^R_2 \leq E^R_3$); FIG. 24 shows the case where the left threshold of the hysteresis characteristic of the third single-hysteresis VCCS circuit is present within the overlapped hysteresis intervals of the hysteresis characteristics of the other two single-hysteresis VCCS circuits, while the right threshold of the hysteresis characteristic of the third single-hysteresis VCCS circuit is present between the right thresholds of the hysteresis characteristics of the first and second single-hysteresis VCCS circuits ($E^L_1 \leq E^L_2 \leq E^L_3 < E^R_1 \leq E^R_3 \leq E^R_2$); and FIG. 25 shows the case where the hysteresis interval of the hysteresis characteristic of the third single-hysteresis VCCS circuit does not overlap with the hysteresis intervals of the hysteresis characteristics of the other two single-hysteresis VCCS circuits ($E^L_1 \leq E^L_2 < E^R_1 \leq E^R_2 \leq E^L_3 < E^R_3$).

Next, an example will be described where two single-hysteresis VCCS circuits having inverse characteristics with each other are connected, that are further connected with a third single-hysteresis VCCS circuit.

Figure 26:
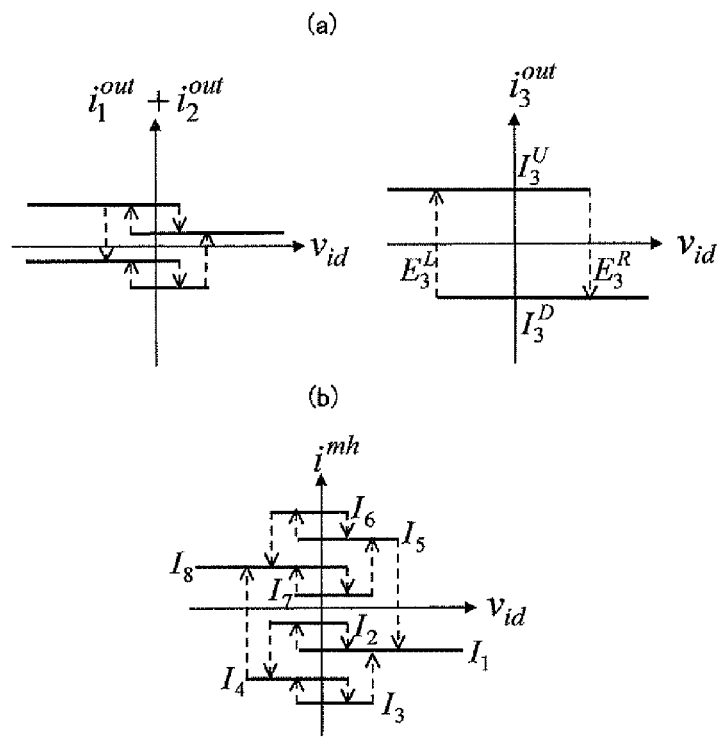
FIG. 26 shows a first example of the multi-hysteresis characteristic constituted by connecting three single-hysteresis VCCS circuits in parallel, that include the inverse hysteresis.
Figure 27:
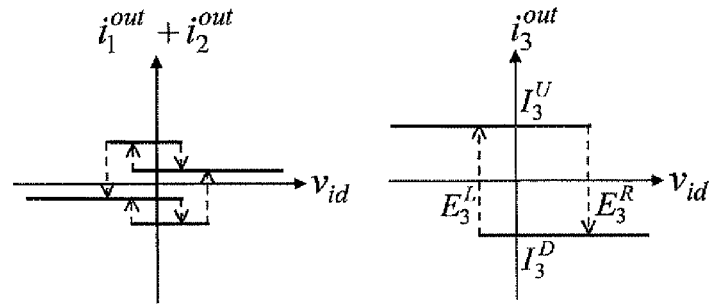
FIG. 27 shows a second example of the multi-hysteresis characteristic constituted by connecting three single-hysteresis VCCS circuits in parallel, that include the inverse hysteresis.
Figure 27:
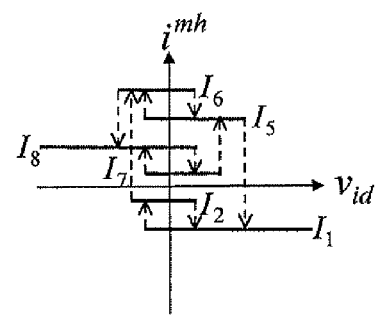
Figure 28:
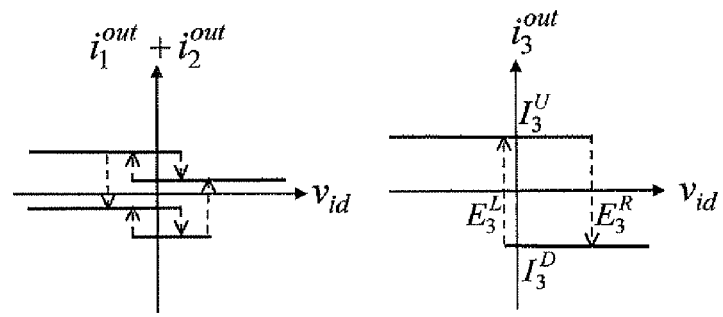
FIG. 28 shows a third example of the multi-hysteresis characteristic constituted by connecting three single-hysteresis VCCS circuits in parallel, that include the inverse hysteresis.
Figure 28:
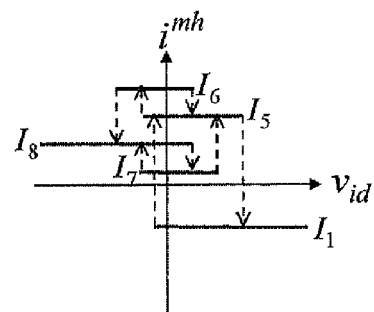
Figure 29:
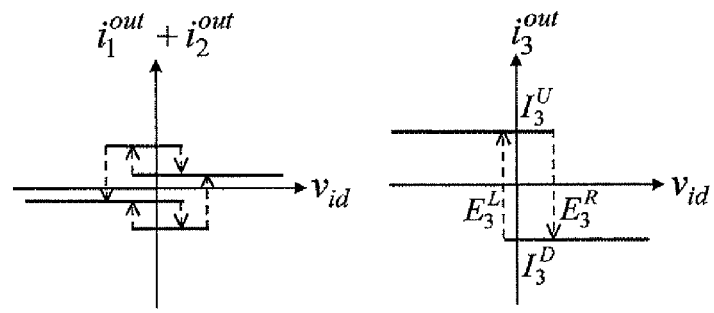
FIG. 29 shows a fourth example of the multi-hysteresis characteristic constituted by connecting three single-hysteresis VCCS circuits in parallel, that include the inverse hysteresis.
Figure 29:
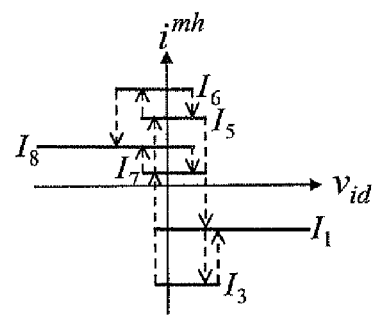
Figure 30:
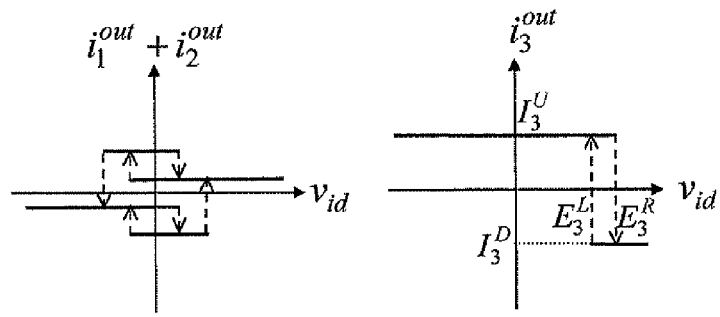
FIG. 30 shows a fifth example of the multi-hysteresis characteristic constituted by connecting three single-hysteresis VCCS circuits in parallel, that include the inverse hysteresis.
Figure 30:
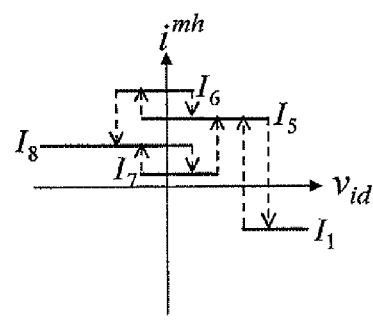

First, FIGS. 26-30 show first to fifth examples of the multi-hysteresis characteristic where two circuits having the hysteresis intervals in the nested structure as shown in FIG. 8 are also connected with another single-hysteresis VCCS circuit. FIG. 26 shows the case where the hysteresis characteristics of three single-hysteresis VCCS circuits have the nested structure ($E^L_3 \leq E^L_2 \leq E^L_1 < E^R_1 \leq E^R_2 \leq E^R_3$); FIG. 27 shows the case where the left threshold of the hysteresis characteristic of the third single-hysteresis VCCS circuit is present between the left thresholds of the hysteresis characteristics of the first and second single-hysteresis VCCS circuits ($E^L_2 \leq E^L_3 \leq E^L_1 < E^R_1 \leq E^R_2 \leq E^R_3$); FIG. 28 shows the case where the left threshold of the hysteresis characteristic of the third single-hysteresis VCCS circuit is present inside of the left thresholds of the hysteresis characteristics of the first and second single-hysteresis VCCS circuits ($E^L_2 \leq E^L_1 \leq E^L_3 < E^R_1 \leq E^R_2 \leq E^R_3$); FIG. 29 shows the case where the left threshold of the hysteresis characteristic of the third single-hysteresis VCCS circuit is present inside of the left thresholds of the hysteresis characteristics of the other two single-hysteresis VCCS circuits, while the right threshold of the hysteresis characteristic of the third single-hysteresis VCCS circuit is present between the right thresholds of the hysteresis characteristics of the first and second single-hysteresis VCCS circuits ($E^L_2 \leq E^L_1 \leq E^L_3 < E^R_1 \leq E^R_3 \leq E^R_2$); and FIG. 30 shows the case where the hysteresis interval of the hysteresis characteristic of the third single-hysteresis VCCS circuit does not overlap with the hysteresis intervals of the hysteresis characteristics of the other two single-hysteresis VCCS circuits ($E^L_2 \leq E^L_1 < E^R_1 \leq E^R_2 \leq E^L_3 < E^R_3$).

Figure 31:
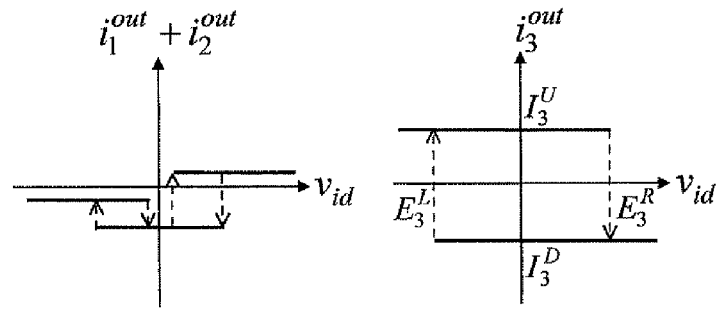
FIG. 31 shows a sixth example of the multi-hysteresis characteristic constituted by connecting three single-hysteresis VCCS circuits in parallel, that include the inverse hysteresis.
Figure 31:
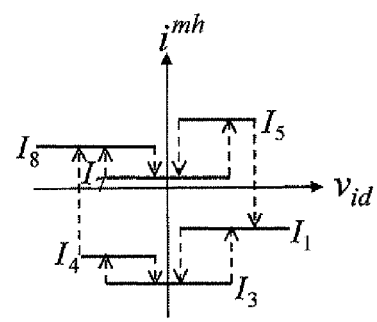
Figure 32:
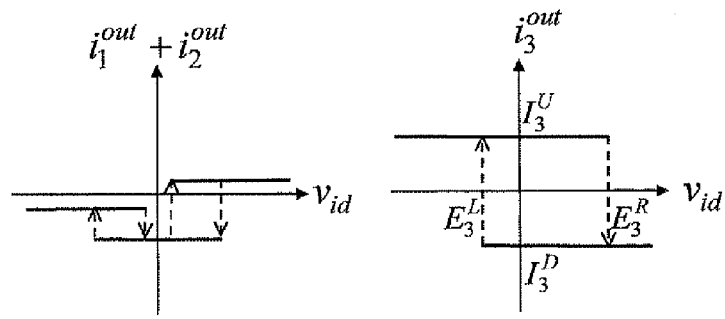
FIG. 32 shows a seventh example of the multi-hysteresis characteristic constituted by connecting three single-hysteresis VCCS circuits in parallel, that include the inverse hysteresis.
Figure 32:
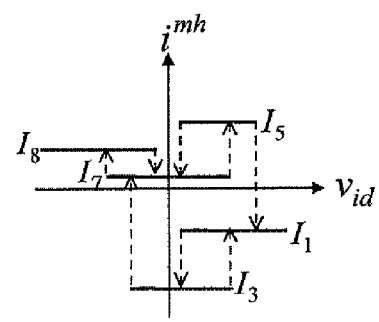
Figure 33:
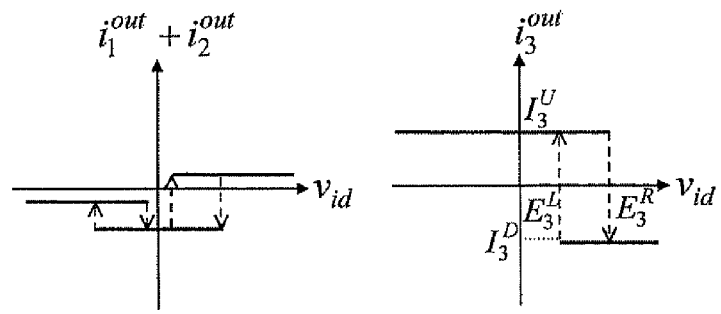
FIG. 33 shows an eighth example of the multi-hysteresis characteristic constituted by connecting three single-hysteresis VCCS circuits in parallel, that include the inverse hysteresis.
Figure 33:
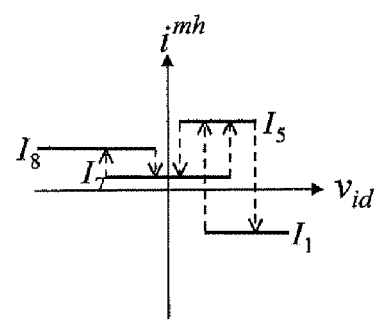
Figure 34:
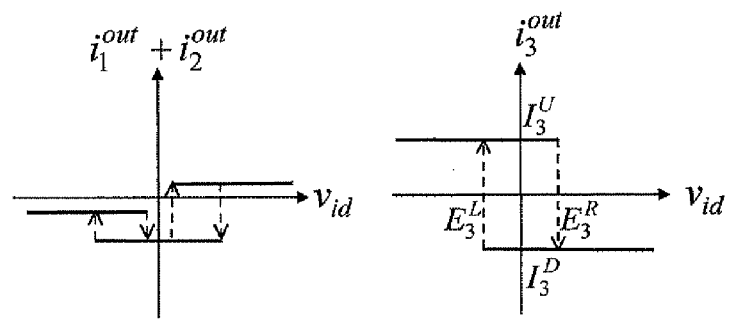
FIG. 34 shows a ninth example of the multi-hysteresis characteristic constituted by connecting three single-hysteresis VCCS circuits in parallel, that include the inverse hysteresis.
Figure 34:
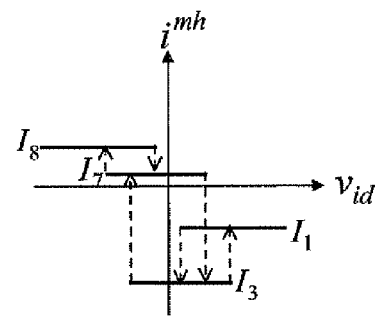
Figure 35:
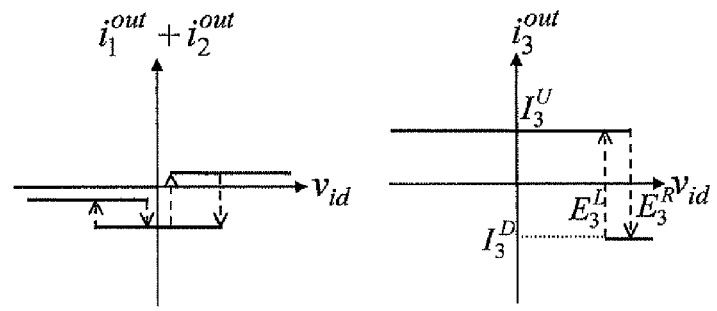
FIG. 35 shows a tenth example of the multi-hysteresis characteristic constituted by connecting three single-hysteresis VCCS circuits in parallel, that include the inverse hysteresis.
Figure 35:
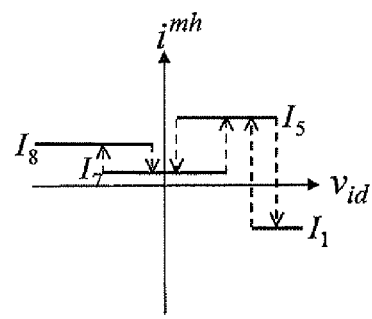

Moreover, FIGS. 31-35 show sixth to tenth examples of the multi-hysteresis characteristic where two single-hysteresis VCCS circuits having the single-hysteresis characteristics inverse with each other with the non-overlapped hysteresis intervals as shown in FIG. 9 are connected in parallel, that are also connected with another single-hysteresis VCCS circuit. FIG. 31 shows the case where both the left and right thresholds of the hysteresis characteristic of the third single-hysteresis VCCS circuit are present outside of the thresholds of the hysteresis characteristics of the other two single-hysteresis VCCS circuits, respectively ($E^L_3 \leq E^L_1 < E^R_1 \leq E^L_2 \leq E^R_2 \leq E^R_3$); FIG. 32 shows the case where the left threshold of the hysteresis characteristic of the third single-hysteresis VCCS circuit is present within the hysteresis interval of the hysteresis characteristic of the first single-hysteresis VCCS circuit ($E^L_1 \leq E^L_3 < E^R_1 \leq E^L_2 < E^R_2 \leq E^R_3$); FIG. 33 shows the case where the left threshold of the hysteresis characteristic of the third single-hysteresis VCCS circuit is present within the hysteresis interval of the hysteresis characteristic of the second single-hysteresis VCCS circuit ($E^L_1 < E^R_1 \leq E^L_2 \leq E^L_3 < E^R_2 \leq E^R_3$); FIG. 34 shows the case where the left threshold of the hysteresis characteristic of the third single-hysteresis VCCS circuit is present within the hysteresis interval of the hysteresis characteristic of the first single-hysteresis VCCS circuit, while the right threshold of the hysteresis characteristic of the third single-hysteresis VCCS circuit is present within the hysteresis interval of the hysteresis characteristic of the second single-hysteresis VCCS circuit ($E^L_1 \leq E^L_3 < E^R_1 \leq E^L_2 \leq E^R_3 < E^R_2$); and FIG. 35 shows the case where the hysteresis interval of the hysteresis characteristic of the third single-hysteresis VCCS circuit does not overlap with the hysteresis intervals of the hysteresis characteristics of the other two single-hysteresis VCCS circuits ($E^L_1 < E^R_1 \leq E^L_2 < E^R_2 \leq E^L_3 < E^R_3$).

Figure 36:
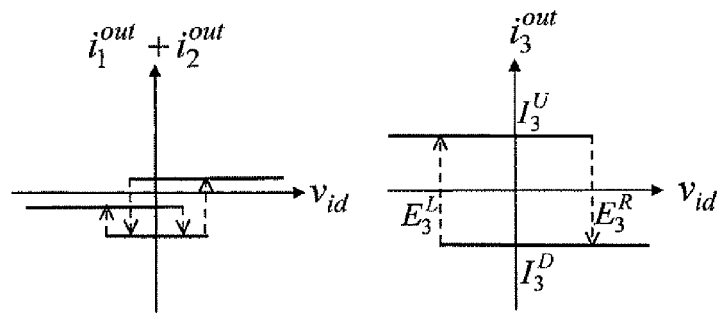
FIG. 36 shows an eleventh example of the multi-hysteresis characteristic constituted by connecting three single-hysteresis VCCS circuits in parallel, that include the inverse hysteresis.
Figure 36:
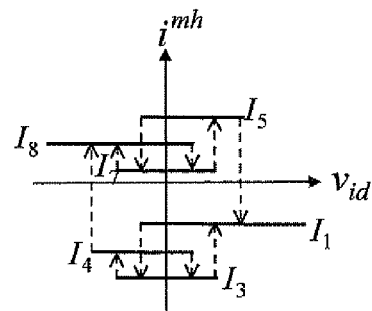
Figure 37:
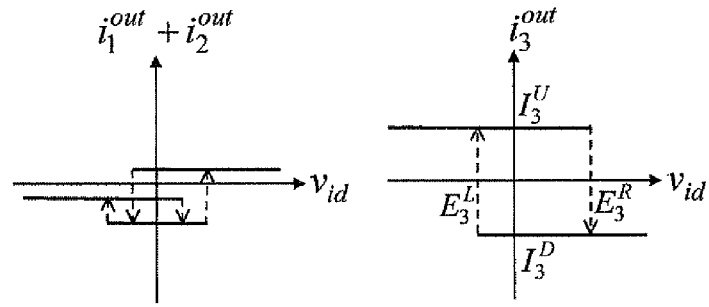
FIG. 37 shows a twelfth example of the multi-hysteresis characteristic constituted by connecting three single-hysteresis VCCS circuits in parallel, that include the inverse hysteresis.
Figure 37:
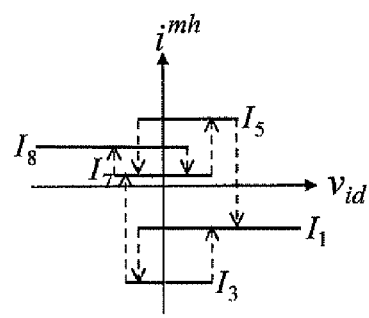
Figure 38:
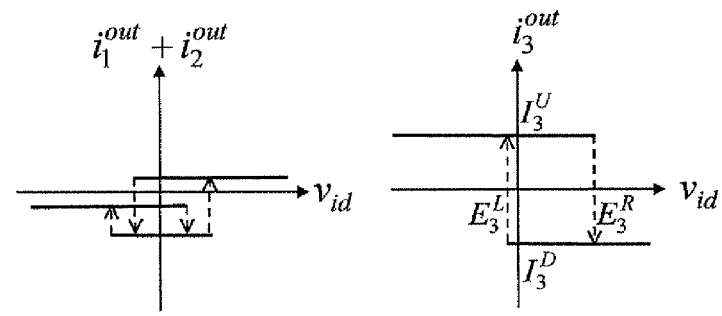
FIG. 38 shows a thirteenth example of the multi-hysteresis characteristic constituted by connecting three single-hysteresis VCCS circuits in parallel, that include the inverse hysteresis.
Figure 38:
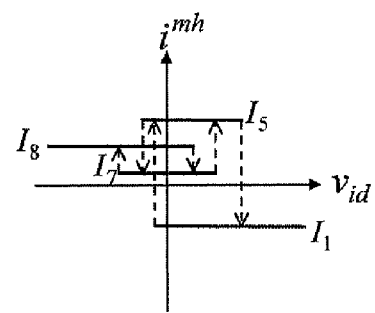
Figure 39:
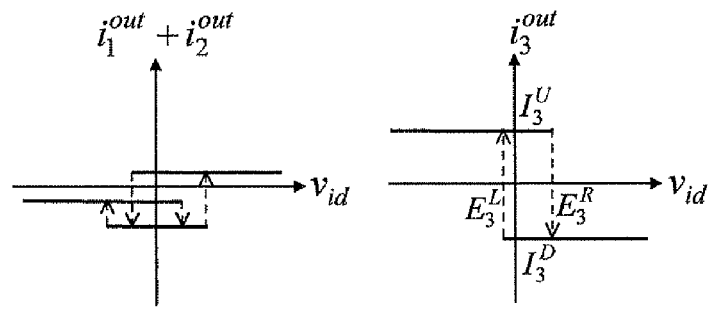
FIG. 39 shows a fourteenth example of the multi-hysteresis characteristic constituted by connecting three single-hysteresis VCCS circuits in parallel, that include the inverse hysteresis.
Figure 39:
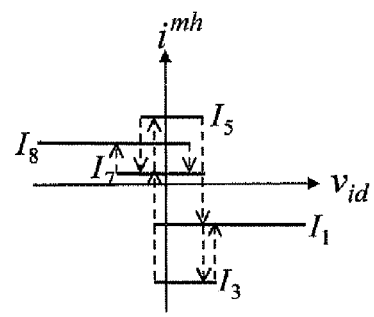
Figure 40:
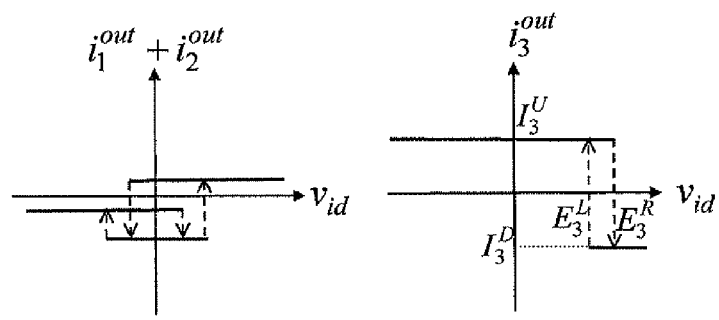
FIG. 40 shows a fifteenth example of the multi-hysteresis characteristic constituted by connecting three single-hysteresis VCCS circuits in parallel, that include the inverse hysteresis.
Figure 40:
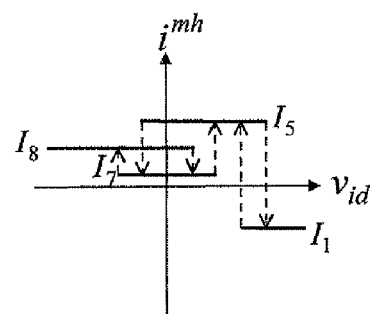

In addition, FIGS. 36-40 show eleventh to fifteenth examples of the characteristic where two single-hysteresis VCCS circuits having the hysteresis characteristics in the partial-overlapped structure as shown in FIG. 10 are connected, that are also connected with another single-hysteresis VCCS circuit. FIG. 36 shows the case where both the left and right thresholds of the hysteresis characteristic of the third single-hysteresis VCCS circuit are present outside of the thresholds of the hysteresis characteristics of the other two single-hysteresis VCCS circuits, respectively ($E^L_3 \leq E^L_1 \leq E^L_2 < E^R_1 \leq E^R_2 < E^R_3$); FIG. 37 shows the case where the left threshold of the hysteresis characteristic of the third single-hysteresis VCCS circuit is present between the left thresholds of the hysteresis characteristics of the first and second single-hysteresis VCCS circuits ($E^L_1 \leq E^L_3 \leq E^L_2 < E^R_1 \leq E^R_2 < E^R_3$); FIG. 38 shows the case where the left threshold of the hysteresis characteristic of the third single-hysteresis VCCS circuit is present within the overlapped hysteresis intervals of the hysteresis characteristics of the other two single-hysteresis VCCS circuits ($E^L_1 \leq E^L_2 \leq E^L_3 < E^R_1 \leq E^R_2 < E^R_3$); FIG. 39 shows the case where the left threshold of the hysteresis characteristic of the third single-hysteresis VCCS circuit is present within the overlapped hysteresis intervals of the hysteresis characteristics of the other two single-hysteresis VCCS circuits, while the right threshold of the hysteresis characteristic of the third single-hysteresis VCCS circuit is present between the right thresholds of the hysteresis characteristics of the first and second single-hysteresis VCCS circuits ($E^L_1 \leq E^L_2 \leq E^L_3 < E^R_1 \leq E^R_3 < E^R_2$); and FIG. 40 shows the case where the hysteresis interval of the hysteresis characteristic of the third single-hysteresis VCCS circuit does not overlap with the hysteresis intervals of the hysteresis characteristics of the other two single-hysteresis VCCS circuits ($E^L_1 \leq E^L_2 < E^R_1 \leq E^R_2 \leq E^L_3 < E^R_3$).

As described above, very complex and various multi-hysteresis characteristics can be realized by combining three single-hysteresis VCCS circuits. Therefore, in general, a great variety of multi-hysteresis characteristics can be realized easily by combining N single-hysteresis VCCS circuits (N is an arbitrary positive integer) using the method of the present invention. Since the characteristics of each single-hysteresis VCCS circuit constituting the circuit can be set up independently, they can be changed even after the multi-hysteresis circuit is constituted.

Next, the implementation of the multi-hysteresis circuit will be described.

Figure 41:
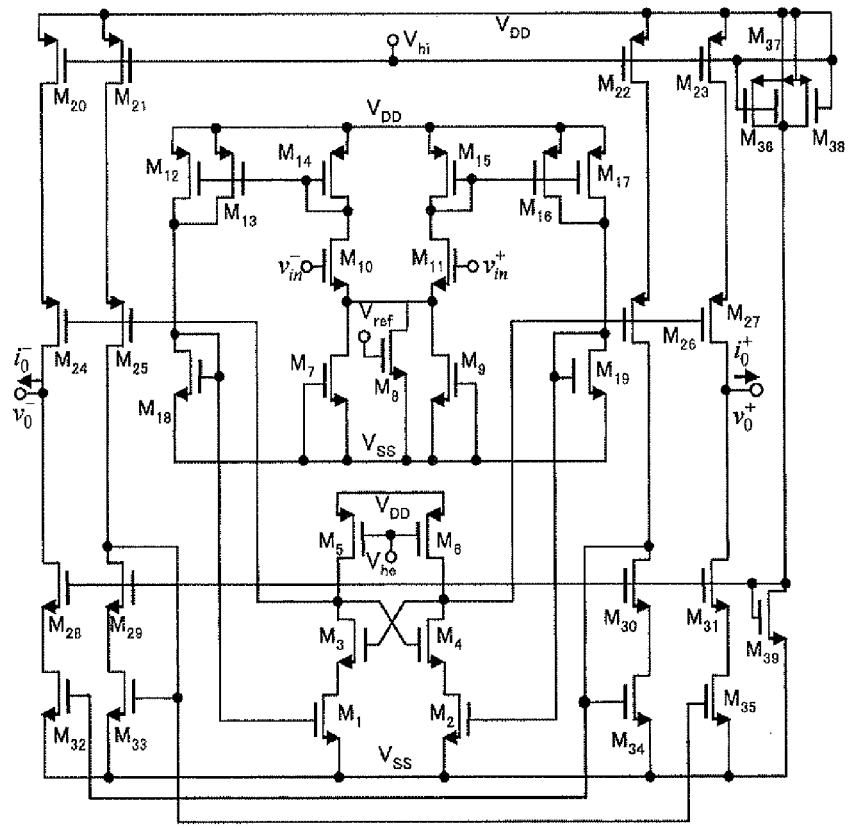
FIG. 41 shows a circuit diagram of a fully-differential single-hysteresis VCCS.

As described above, the multi-hysteresis VCCS system of the present invention is constituted by a plurality of single-hysteresis VCCS circuits connected in parallel. First, FIG. 41 shows an implementation of the single-hysteresis circuit with a fully-differential configuration serving as the fundamental components (see Non-Patent Documents 15, 16, and 17 above proposed by the present inventors). This circuit is mainly constituted by an operational transconductance amplifier (OTA) and a latch circuit. The output voltage of the OTA ($M_7$ to $M_{19}$) serve as the input voltage of the latch circuit ($M_1$ to $M_6$). The latch circuit is constituted by a differential pair ($M_1$, $M_2$), current sources ($M_5$, $M_6$), and a pair of cross-coupled MOSFETs ($M_3$, $M_4$). As the gate voltage of the MOSFET $M_2$ becomes high, the current that flows to the MOSFET $M_2$ increases, so that the drain voltage of the MOSFET $M_2$, i.e. the source voltage of the MOSFET $M_4$, drops. Thereby, the drain voltage of the MOSFET $M_4$, i.e. the gate voltage of the MOSFET $M_3$, drops. As such, the current flowing to the MOSFET $M_3$ decreases and the drain voltage of the MOSFET $M_3$, i.e. the gate voltage of the MOSFET $M_4$, rises. Thereby, the drain current of the MOSFET $M_4$ increases further and the drain voltage of the MOSFET $M_4$, i.e. the gate voltage of the MOSFET $M_3$, drops further. This generates the positive feedback so that the steep falling characteristic of the drain voltage of the MOSFET $M_4$ is obtained. Then, while the current that flows to the MOSFET $M_2$ tries to decrease as the gate voltage of the MOSFET $M_2$ drops, the gate of the MOSFET $M_4$ is kept at a high potential because of the positive feedback and thus the current to the MOSFET $M_2$ cannot decrease rapidly. As a result, the drain voltage of the MOSFET $M_2$, i.e. the source voltage of the MOSFET $M_4$, rises and the gate-source voltage of the MOSFET Mg decreases. When the gate-source voltage of the MOSFET Mg decreases to a certain value, the drain voltage of the MOSFET $M_4$ rises and the MOSFET $M_3$ is suddenly turned ON while the MOSFET $M_4$ is turned OFF because of the positive feedback. In this manner, the steep rising characteristic of the drain voltage of the MOSFET Mg can be obtained. During a course of the process, a difference is generated between the input voltage value at which the MOSFET Mg is turned ON as the gate voltage of the MOSFET $M_2$ rises and the input voltage value at which the MOSFET $M_4$ is turned OFF as the gate voltage of the MOSFET $M_2$ drops, such that the hysteresis characteristic can be realized. In addition, by regulating the current values of the current sources of the MOSFETs $M_5$ and $M_6$ with an external control voltage $V_{he}$, the values of the drain-source voltages of the MOSFETs $M_5$ and $M_6$ can be changed. As the drain-source voltages of the MOSFETs $M_5$ and $M_6$ increase, driving ranges of the MOSFET $M_1$ to the MOSFET $M_4$ narrow and a range of the threshold voltage of the hysteresis characteristic decreases. In addition, by dropping the gate voltage of the current sources of the MOSFET $M_5$ and $M_6$, a range of the threshold voltages of the hysteresis characteristic is extended. In this manner, a range of the threshold voltage of the hysteresis characteristic can be adjusted by regulating the voltage value of $V_{he}$.

Figure 42:
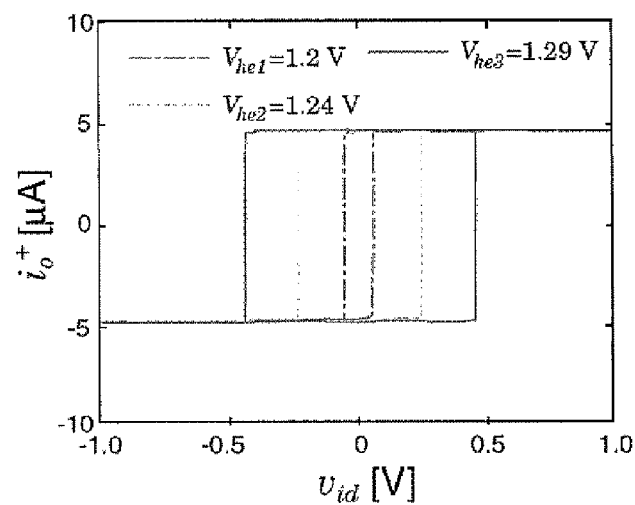
FIG. 42 shows a $v_{id}$-$i_0^+$ characteristic of the fully-differential single-hysteresis VCCS circuit when its external control voltage $V_{he}$ is changed.

FIG. 42 shows $v_{id}$-$i_0^+$ characteristics obtained from the SPICE simulation using the fully-differential single-hysteresis VCCS circuit shown in FIG. 41 where the external control voltages $V_{he}$ are set to 1.2 V, 1.24 V, and 1.29 V, respectively. Table 1 shows the sizes of each transistor in FIG. 41 used in this simulation.

TABLE 1

| Elements | W/L | Elements | W/L |
|---|---|---|---|
| $M_{1, 2}$ | 1.2 μm/2 μm | $M_{3, 4}$ | 4 μm/1 μm |
| $M_{5, 6}$ | 13 μm/1 μm | $M_{7, 9}$ | 0.5 μm/1 μm |
| $M_8$ | 4.4 μm/2 μm | $M_{10, 11}$ | 1 μm/2 μm |
| $M_{12, 14, 15, 17}$ | 1.1 μm/2 μm | $M_{13, 16}$ | 1.05 μm/2 μm |
| $M_{18, 19}$ | 0.8 μm/2 μm | $M_{20, 23}$ | 21.6 μm/2 μm |
| $M_{21, 22}$ | 10.8 μm/2 μm | $M_{28, 31}$ | 3.2 μm/2 μm |
| $M_{29, 30}$ | 1.6 μm/2 μm | $M_{32, 35}$ | 7.2 μm/2 μm |
| $M_{33, 34}$ | 3.6 μm/2 μm | $M_{36, 37, 38}$ | 5.4 μm/1 μm |
| $M_{39}$ | 1 μm/3.5 μm | | |

Figure 43:
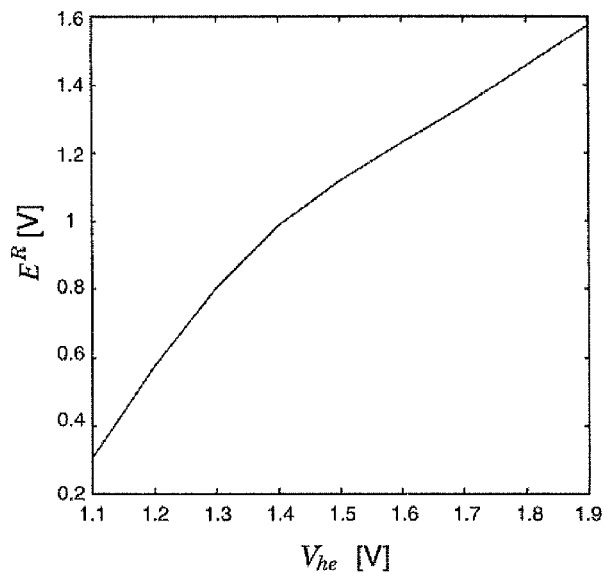
FIG. 43 shows a change in a threshold voltage $E^R$ for the external control voltage $V_{he}$.

The simulation results show that the threshold voltages were +/−0.058 V, +/−0.237 V, and +/−0.445 V, for the external control voltages $V_{he}$ of 1.2 V, 1.24 V, and 1.29 V, respectively. FIG. 43 shows a change in the threshold voltage $E^R$ for the external control voltage $V_{he}$.

Figure 44:
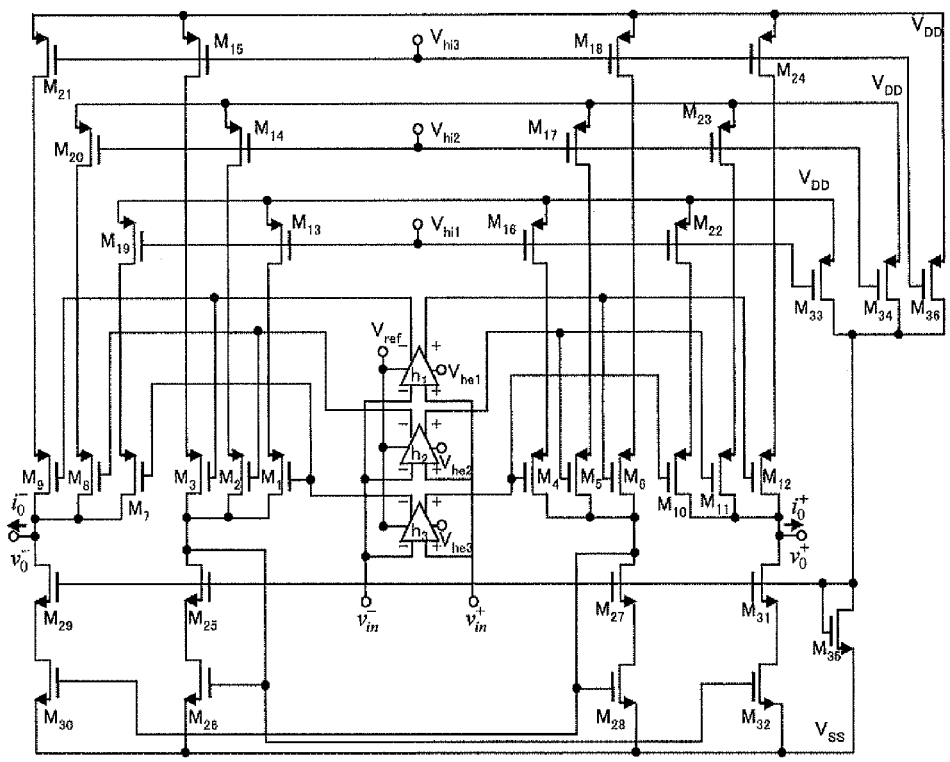
FIG. 44 shows a configuration of a fully-differential multi-hysteresis VCCS system (N=3)

The multi-hysteresis system can be realized by connecting a plurality of the fully-differential single-hysteresis VCCS circuits described above in parallel. FIG. 44 shows an example of the multi-hysteresis system incorporating three fully-differential single-hysteresis VCCS circuits. In FIG. 44, triangular symbols ($h_1$, $h_2$, $h_3$) represent core circuit portions formed of transistors, MOSFETs $M_1$ to $M_9$, in FIG. 41.

Figure 45:
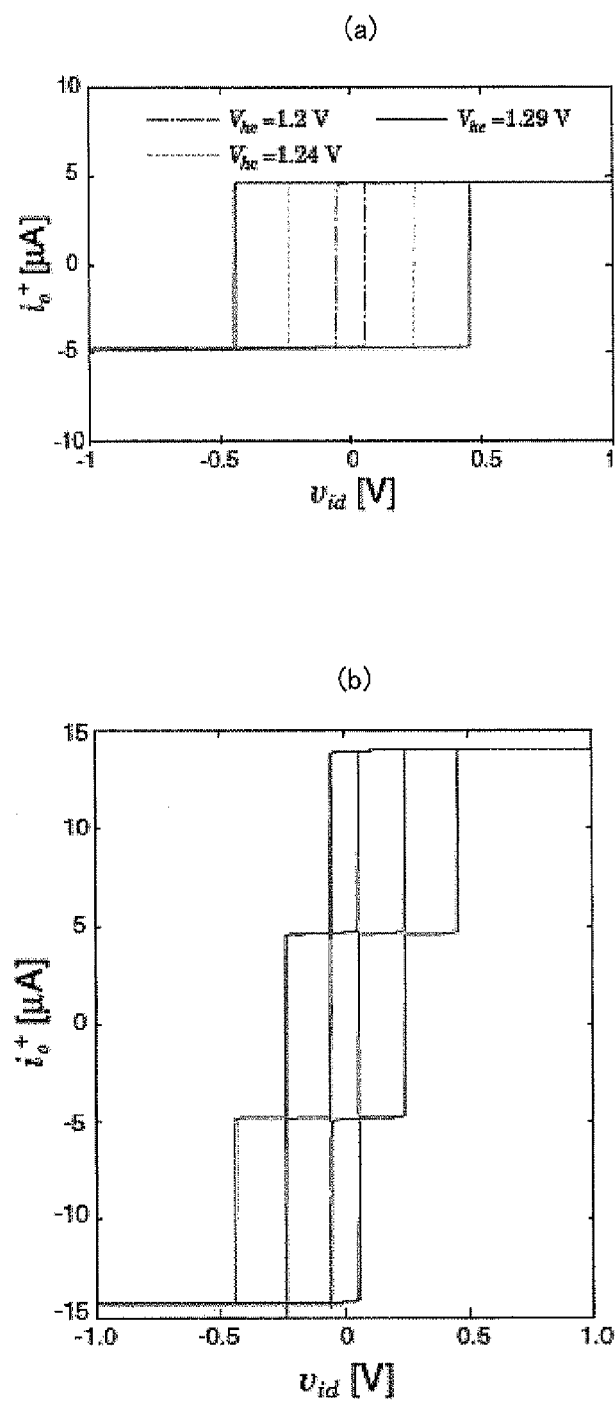
FIG. 45 shows a $v_{id}$-$i_0^+$ characteristic of the fully-differential multi-hysteresis VCCS system.

FIG. 45 shows results of the SPICE simulation for the multi-hysteresis VCCS system shown in FIG. 44, and Table 2 shows the sizes of the transistors used in this simulation.

TABLE 2

| Elements | W/L | Elements | W/L |
|---|---|---|---|
| $M_{1, 2, 3, 4, 5, 6}$ | 1.6 μm/1 μm | $M_{7, 8, 9, 10, 11, 12}$ | 1.6 μm/1 μm |
| $M_{13, 14, 15}$ | 10.8 μm/2 μm | $M_{16, 17, 18}$ | 10.8 μm/2 μm |
| $M_{19, 20, 21}$ | 21.6 μm/2 μm | $M_{22, 23, 24}$ | 21.6 μm/2 μm |
| $M_{25, 27}$ | 1.6 μm/1 μm | $M_{26, 28}$ | 3.6 μm/2 μm |

TABLE 2-continued

| Elements | W/L | Elements | W/L |
|---|---|---|---|
| $M_{29, 31}$ | 3.2 μm/1 μm | $M_{30, 32}$ | 7.2 μm/2 μm |
| $M_{33, 34, 36}$ | 5.4 μm/2 μm | $M_{35}$ | 1 μm/3.5 μm |

FIG. 45(a) shows superimposed input and output characteristics of three single-hysteresis VCCS circuits having different threshold voltages contained in the circuit in FIG. 44. FIG. 45(b) shows the multi-hysteresis characteristic which was realized by combining these circuits.

FIGS. 46(a), (b), and (c) show the characteristics of the fully-differential multi-hysteresis VCCS system obtained from the SPICE simulations where the relationship among the thresholds were similar to those of the characteristics shown in FIGS. 12(b), 13(b), and 14(b), respectively. Table 3 shows the external control voltages used in these simulations.

TABLE 3

Figure 46:
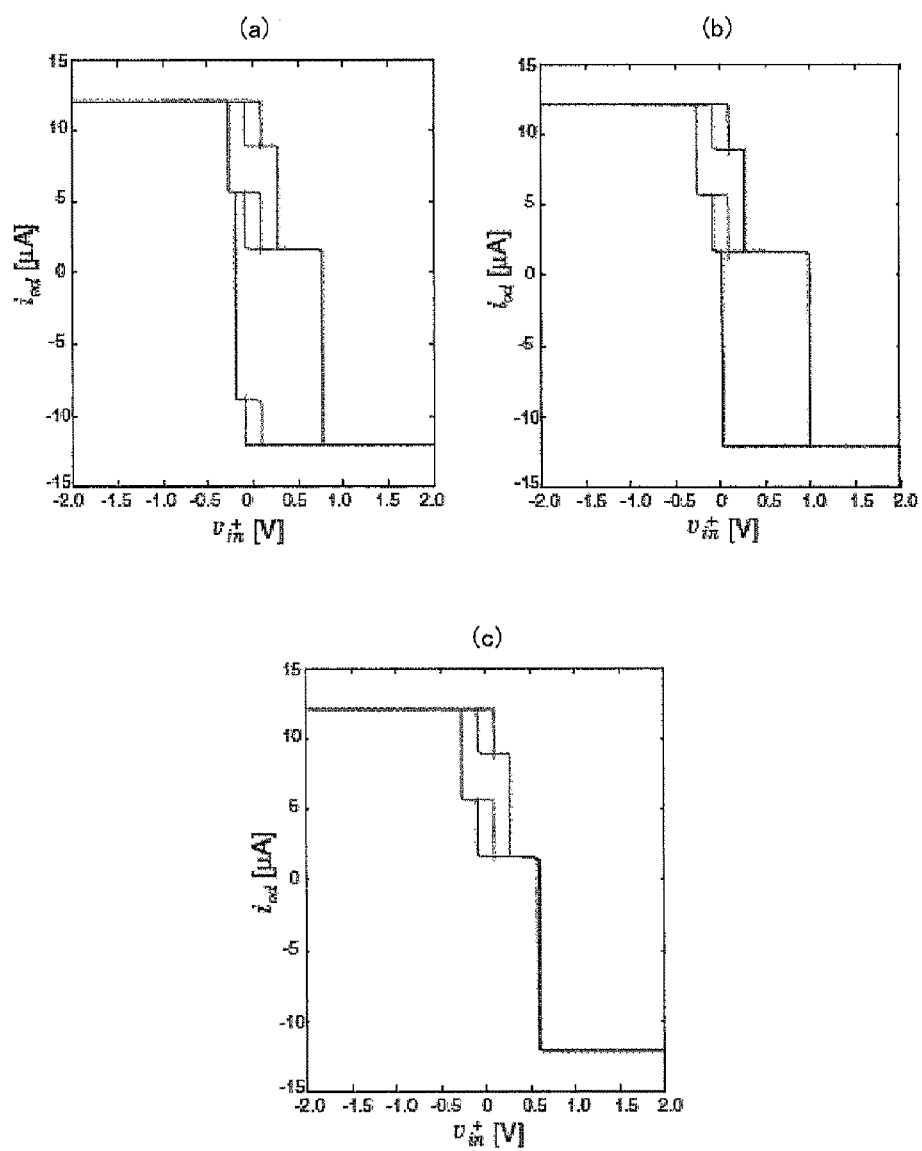
FIG. 46 shows a characteristic of the fully-differential multi-hysteresis VCCS system obtained from the SPICE simulation.

| | Control Voltages | | |
|---|---|---|---|
| Control Voltages | FIG. 46 (a) | FIG. 46 (b) | FIG. 46 (c) |
| $V_{he1}$ | 1.20 V | 1.20 V | 1.20 V |
| $V_{he2}$ | 1.24 V | 1.24 V | 1.24 V |
| $V_{he3}$ | 1.29 V | 1.29 V | 1.18 V |
| $V_{ref1}$ | −1.25 V | −1.25 V | −1.25 V |
| $V_{ref2}$ | −1.25 V | −1.25 V | −1.25 V |
| $V_{ref3}$ | −1.25 V | −1.25 V | −1.25 V |
| $V_{hi1}$ | 1.40 V | 1.40 V | 1.40 V |
| $V_{hi2}$ | 1.35 V | 1.35 V | 1.35 V |
| $V_{hi3}$ | 1.29 V | 1.29 V | 1.29 V |
| $V_{w1}$ | 0.00 V | 0.00 V | 0.00 V |
| $V_{w2}$ | 0.00 V | 0.00 V | 0.00 V |
| $V_{w3}$ | 0.28 V | 0.28 V | 0.60 V |

In Table 3, $V_{hek}$, $V_{refk}$, $V_{hik}$, and $V_{wk}$ (k=1, 2, 3) represent the external control voltages of the k-th single-hysteresis VCCS circuit contained in the multi-hysteresis VCCS system, respectively. Furthermore, in the simulations, the characteristics were measured by keeping $v_{in}^-$ terminals of the single-hysteresis VCCS circuits ($h_1$ to $h_3$) at the voltages $V_{w1}$ to $V_{w3}$, respectively, and changing a common $v_{in}^+$ voltage.

In this manner, according to the present invention, the multi-hysteresis voltage controlled current source system providing the multi-hysteresis VCCS characteristic can be realized by connecting the single-hysteresis VCCS circuits in parallel. Moreover, in order to verify the validity of the present invention, there has been provided the circuit examples for realizing the multi-hysteresis VCCS characteristic and the SPICE simulation results of the circuits. The diverse multi-hysteresis VCCS characteristics can be realized easily by the multi-hysteresis voltage controlled current source system of the present invention. In addition, since the characteristics of the single-hysteresis VCCS circuits constituting the multi-hysteresis voltage controlled current source circuit can be set up independently from each other, the shape of the combined multi-hysteresis characteristic can be controlled easily using the external voltages which control the characteristics of the respective single-hysteresis VCCS circuits. As such, the number of stages or the shapes of the hysteresis characteristics, as well as the multi-hysteresis characteristics including the thresholds and the saturation current values, can be controlled even during the operation of the circuit, allowing more diverse operations.

It is expected that such diverse multi-hysteresis VCCS characteristics can be applied to the realization of multi-hysteresis chaotic oscillators presenting very complex attractors or the constitution of large-scaled and complex hybrid dynamical systems, as well as the implementation of multi-valued logic function circuits or multivalued memory circuits and multi-hysteresis neural networks utilizing multivalued states.

The present invention should not be limited to the embodiments described above, and a number of variations are possible on the basis of the spirit of the present invention. These variations should not be excluded from the scope of the present invention.

Industrial Applicability

The multi-hysteresis voltage controlled current source system of the present invention is applicable to the realization of multi-hysteresis chaotic oscillators presenting very complex attractors or the constitution of large-scaled and complex hybrid dynamical systems, as well as the implementation of multivalued logic function circuits or multivalued memory circuits and multi-hysteresis neural networks utilizing multi-valued statuses.

The invention claimed is:

1. A multi-hysteresis voltage controlled current source system constituted by connecting single-hysteresis voltage controlled current source circuits as fundamental components in parallel, and applying a differential input voltage to the single-hysteresis voltage controlled current source circuits, so that a plurality of discrete values of current can be output based on the single-hysteresis voltage controlled current source circuits.

2. The multi-hysteresis voltage controlled current source system according to claim 1, wherein characteristics of the single-hysteresis voltage controlled current source circuits are enabled to be set independently from each other, so that changing the characteristics allows a variety of multi-hysteresis VCCS characteristics to be obtained.

3. The multi-hysteresis voltage controlled current source system according to claim 1, wherein N single-hysteresis voltage controlled current source circuits (N is an arbitrary positive integer) are connected in parallel.

4. The multi-hysteresis voltage controlled current source system according to claim 1, wherein the single-hysteresis voltage controlled current source circuits connected in parallel include only a combination of circuits having a normal hysteresis characteristic.

5. The multi-hysteresis voltage controlled current source system according to claim 1, wherein the single-hysteresis voltage controlled current source circuits connected in parallel include only a combination of circuits having an inverse hysteresis characteristic.

6. The multi-hysteresis voltage controlled current source system according to claim 1, wherein the single-hysteresis voltage controlled current source circuits connected in parallel include a combination of a circuit having the normal hysteresis characteristic and a circuit having the inverse hysteresis characteristic.

7. The multi-hysteresis voltage controlled current source system according to claim 6, wherein the single-hysteresis voltage controlled current source circuits connected in parallel include a combination of two circuits each having the normal hysteresis characteristic and the inverse hysteresis characteristic.

8. The multi-hysteresis voltage controlled current source system according to claim 4, wherein three single-hysteresis voltage controlled current source circuits are connected in parallel.

9. The multi-hysteresis voltage controlled current source system according to claim 1, wherein the single-hysteresis voltage controlled current source circuits connected in parallel include an operational transconductance amplifier (OTA) and a latch circuit.

10. The multi-hysteresis voltage controlled current source system according to claim 9, wherein a range of threshold voltages is changed by controlling external control voltage ($V_{he}$) of the latch circuit.

11. The multi-hysteresis voltage controlled current source system according to claim 1, wherein the single-hysteresis voltage controlled current source circuits connected in parallel incorporate three fully-differential single-hysteresis voltage controlled current source circuits.

* * * * *